(12) United States Patent
Cohen

(10) Patent No.: US 7,351,321 B2
(45) Date of Patent: *Apr. 1, 2008

(54) METHOD FOR ELECTROCHEMICAL FABRICATION

(75) Inventor: Adam L. Cohen, Rancho Palos Verdes, CA (US)

(73) Assignee: Microfabrica, Inc., Van Nuys, CA (US)

(*) Notice: Subject to any disclaimer, the term of this patent is extended or adjusted under 35 U.S.C. 154(b) by 725 days.

This patent is subject to a terminal disclaimer.

(21) Appl. No.: 10/677,548

(22) Filed: Oct. 1, 2003

(65) Prior Publication Data

US 2004/0084319 A1 May 6, 2004

Related U.S. Application Data

(60) Continuation of application No. 09/493,496, filed on Jan. 28, 2000, now Pat. No. 6,790,377, which is a division of application No. 09/055,183, filed on Apr. 3, 1998, now Pat. No. 6,027,630.

(60) Provisional application No. 60/043,742, filed on Apr. 4, 1997.

(51) Int. Cl.
*C25D 5/02* (2006.01)
*C25D 5/48* (2006.01)
*C25D 5/52* (2006.01)

(52) U.S. Cl. .................. 205/118; 205/170; 205/221; 205/222

(58) Field of Classification Search ............ 427/258, 427/259, 282, 264, 265, 331; 205/118, 170, 205/221, 222

See application file for complete search history.

(56) References Cited

U.S. PATENT DOCUMENTS

| 2,306,082 | A |   | 12/1942 | Prest | ............... | 204/18 |
| 3,240,685 | A |   | 3/1966 | Maissel | ............... | 204/15 |
| 3,697,401 | A |   | 1/1970 | Lucas et al. | ............... | 204/143 |
| 3,745,105 | A |   | 7/1973 | Kosowsky et al. | ............... | 204/224 |
| 3,835,017 | A |   | 9/1974 | Mentone et al. | ............... | 204/224 |
| 3,926,916 | A | * | 12/1975 | Mastrangelo | ............... | 428/220 |
| 4,043,891 | A |   | 8/1977 | Alkire et al. | ............... | 204/231 |

(Continued)

FOREIGN PATENT DOCUMENTS

DE           32 12 152 A1    10/1983

(Continued)

OTHER PUBLICATIONS

John D. Madden, et al., "Three-Dimensional Microfabrication by Localized, Electrochemical Deposition", J. of Micro. Sys., Mar. 1996, 5(1):24-32.

(Continued)

*Primary Examiner*—Edna Wong
(74) *Attorney, Agent, or Firm*—Dennis R. Smalley

(57) ABSTRACT

An electroplating method that includes: a) contacting a first substrate with a first article, which includes a substrate and a conformable mask disposed in a pattern on the substrate; b) electroplating a first metal from a source of metal ions onto the first substrate in a first pattern, the first pattern corresponding to the complement of the conformable mask pattern; and c) removing the first article from the first substrate, is disclosed. Electroplating articles and electroplating apparatus are also disclosed.

16 Claims, 13 Drawing Sheets

U.S. PATENT DOCUMENTS

| | | | |
|---|---|---|---|
| 4,080,267 A | 3/1978 | Castellani et al. | 204/15 |
| 4,126,533 A | 11/1978 | Lukyanchikov et al. | 204/224 |
| 4,155,815 A | 5/1979 | Francis et al. | 204/15 |
| 4,187,553 A | 2/1980 | Ahn et al. | 365/8 |
| 4,294,669 A | 10/1981 | Lincoln et al. | 204/15 |
| 4,370,941 A | 2/1983 | Belton | 118/13 |
| 4,376,017 A | 3/1983 | Urion | 204/15 |
| 4,404,080 A | 9/1983 | Jahani | 204/224 |
| 4,452,684 A | 6/1984 | Palnik | 204/206 |
| 4,537,647 A | 8/1985 | Foster | 156/245 |
| 4,764,449 A | 8/1988 | VanIseghem | 430/162 |
| 4,770,754 A | 9/1988 | Meuldijk et al. | 204/224 |
| 4,920,639 A * | 5/1990 | Yee | 29/846 |
| 4,921,583 A | 5/1990 | Sewell et al. | 204/15 |
| 4,954,192 A | 9/1990 | Dziekan | 156/154 |
| 4,985,116 A | 1/1991 | Mettler et al. | 156/656 |
| 5,011,580 A * | 4/1991 | Pan et al. | 205/118 |
| 5,190,637 A | 3/1993 | Guckel | 205/118 |
| 5,209,817 A | 5/1993 | Ahmad et al. | 156/643 |
| 5,271,822 A | 12/1993 | Nolan et al. | 205/122 |
| 5,378,583 A | 1/1995 | Guckel et al. | 430/325 |
| 5,395,508 A | 3/1995 | Jolly et al. | 130/549 |
| 5,413,668 A | 5/1995 | Aslam et al. | 216/2 |
| 5,435,902 A | 7/1995 | Andre, Sr. | 205/67 |
| 5,478,699 A | 12/1995 | Blessington et al. | 430/308 |
| 5,501,784 A | 3/1996 | Lessmollmann et al. | 205/67 |
| 5,512,162 A | 4/1996 | Sachs et al. | 205/91 |
| 5,560,837 A | 10/1996 | Trueba | 216/27 |
| 5,605,614 A | 2/1997 | Bornand | 205/50 |
| 5,614,075 A | 3/1997 | Andre, Sr. | 205/67 |
| 5,641,391 A | 6/1997 | Hunter et al. | 205/80 |
| 5,766,441 A | 6/1998 | Arndt et al. | 205/170 |
| 5,874,011 A | 2/1999 | Ehrlich | 216/65 |
| 6,019,784 A | 2/2000 | Hines | 128/898 |
| 6,197,180 B1 | 3/2001 | Kelly | 205/118 |
| 6,475,369 B1 * | 11/2002 | Cohen | 205/135 |

FOREIGN PATENT DOCUMENTS

| | | |
|---|---|---|
| GB | 2 127 855 A | 4/1984 |
| JP | 59-191356 A | 10/1984 |
| JP | 61-210636 A | 9/1986 |
| JP | 1-255682 A | 12/1989 |
| JP | 04-318187 A | 11/1992 |
| JP | 07-022425 A | 1/1995 |

OTHER PUBLICATIONS

Taylor, et al., "'Spatial Forming' A Three Dimensional Printing Process", IEEE, 1995, pp. 203-208, no month.

Marques, et al., "Fabrication of High-Aspect-Ratio Microstructures on Planar and Nonplanar Surfaces Using a Modified LIGA Process", Dec. 1997, 6(4):329-336.

Kumar, et al., "Features of gold having micrometer to centimeter dimensions can be formed through a combination of stamping with an elastomeric stamp . . . " Appln. Phys. Lett., Jul. 1993, 63(14): 2002-2004.

* cited by examiner

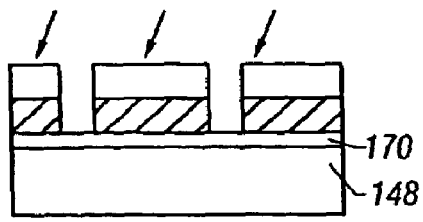
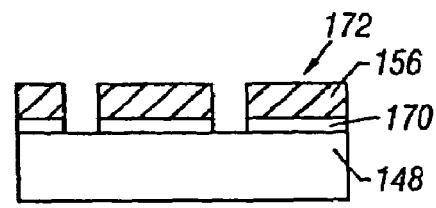
FIG. 8d  FIG. 8e
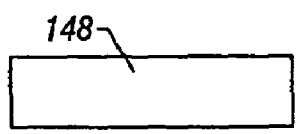
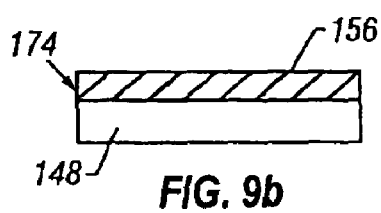
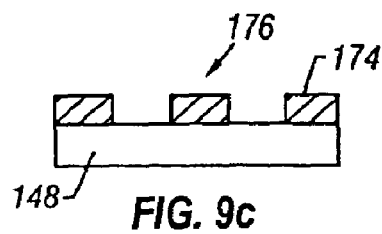
FIG. 9a  FIG. 9b  FIG. 9c
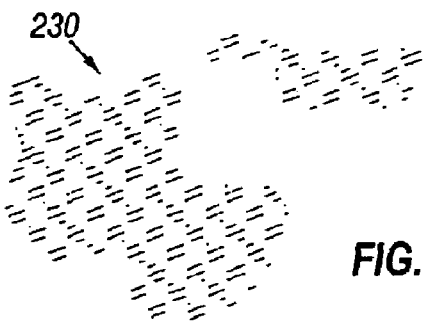
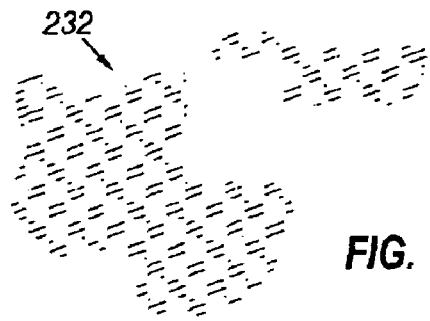
FIG. 10a  FIG. 10b
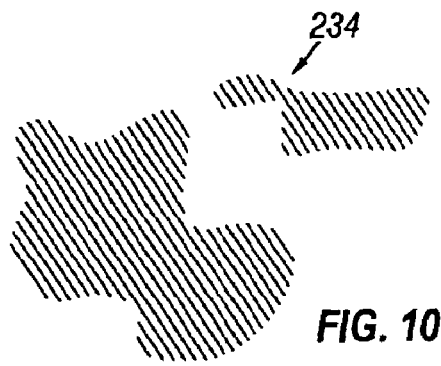
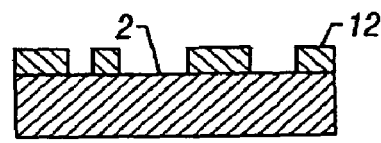
FIG. 10c  FIG. 12a
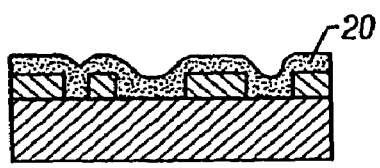
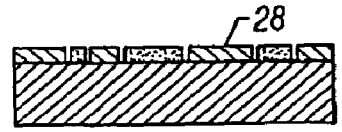
FIG. 12b  FIG. 12c

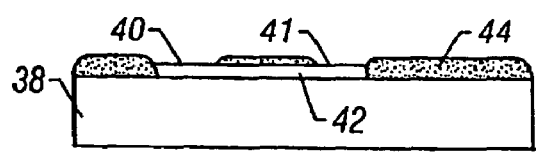
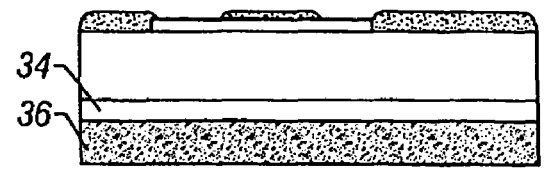
*FIG. 13a*  *FIG. 13b*
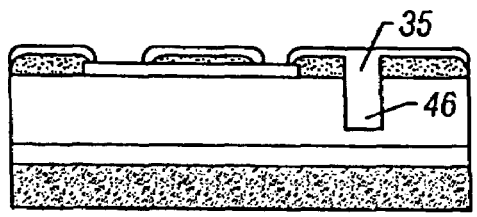
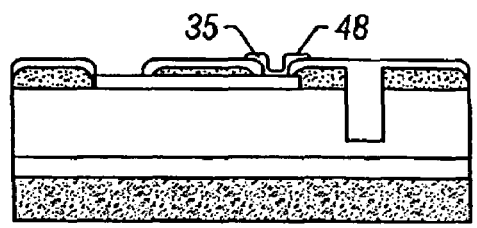
*FIG. 13c*  *FIG. 13d*
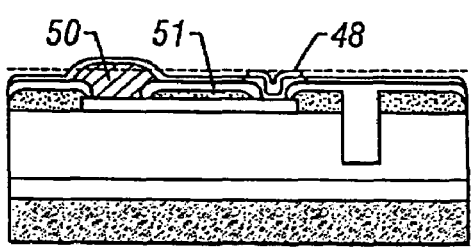
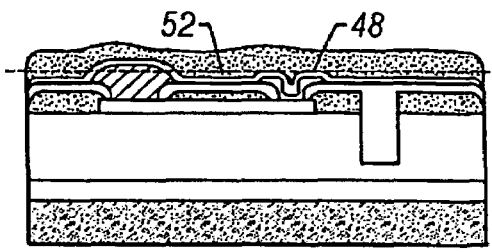
*FIG. 13e*  *FIG. 13f*
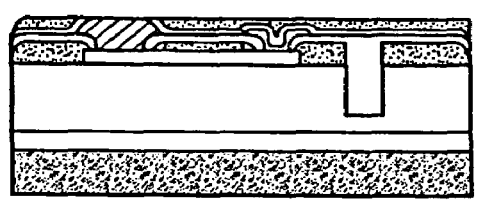
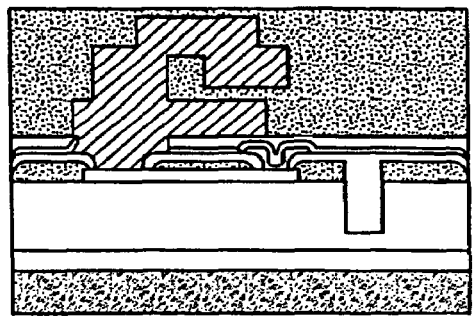
*FIG. 13g*
*FIG. 13h*
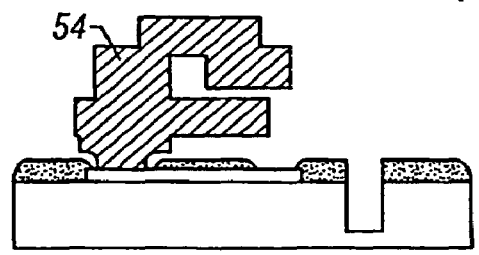
*FIG. 13i*

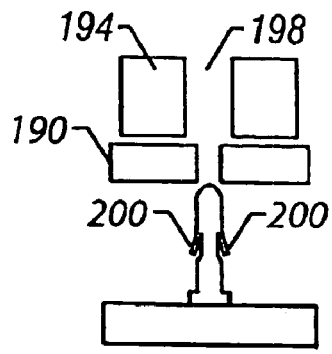
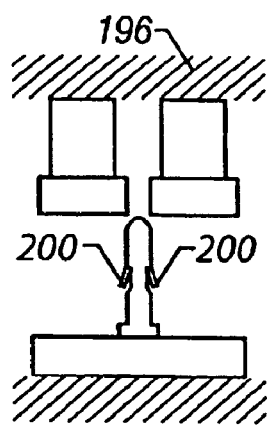
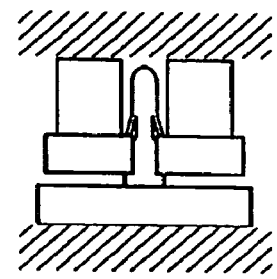
FIG. 14a          FIG. 14b          FIG. 14c
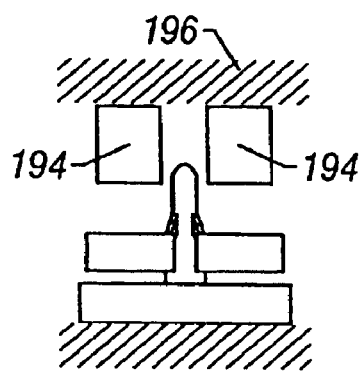
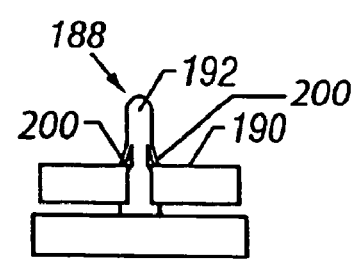
FIG. 14d          FIG. 14e
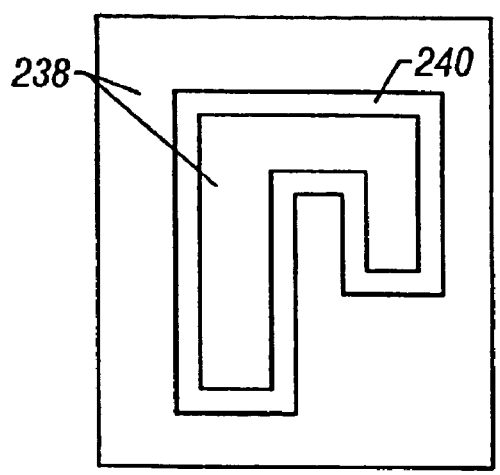
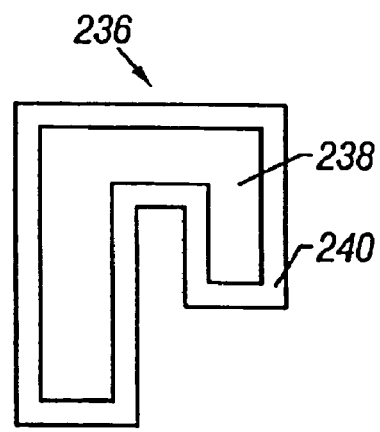
FIG. 15a          FIG. 15b

METHOD FOR ELECTROCHEMICAL FABRICATION

CROSS REFERENCE TO RELATED APPLICATIONS

This application is a continuation of U.S. Utility Patent Application Ser. No. 09/493,496, filed Jan. 28, 2000 now U.S. Pat. No. 6,790,377, which is a divisional of U.S. patent application Ser. No. 09/055,183, filed Apr. 3, 1998, now U.S. Pat. No. 6,027,630; which in turn claims benefit to U.S. Provisional Patent Application No. 60/043,742, filed on Apr. 4, 1997. Each of these prior applications is incorporated herein by reference as if set forth in full.

BACKGROUND OF THE INVENTION

The invention relates to forming structures by electrochemical deposition.

Microfabrication processes (also referred to as micromachining) are being developed and refined for eventual application to the manufacture of complex devices including machines and instrumentation. These processes are being directed to the production of machines of miniaturized devices having features in the range of a few microns and in some cases features in the submicron range, some of which currently exist on a macroscopic scale.

Microfabrication processes include: bulk micromachining, in which material is removed from regions of a substrate; surface micromachining, in which a thin conformal structural layer and one or more sacrificial layers are deposited onto a substrate; and LIGA, which generates 2.5-D extruded shapes by molding materials around metals molds which were formed by the metals being electrodeposited within openings in thick synchrotron-processed photoresists. These processes are used to produce structures of simple geometries (e.g., they can be defined by 1-4 different cross sections), and are usually customized for each application.

Solid freeform fabrication, which is also referred to as rapid prototyping, is used to manufacture macroscopic parts from hundreds of layers by generating one layer at a time. These processes produce features typically greater than 50-100 µm in width using layers typically greater than 50-150 µm thick. These processes typically generate a layer serially. These processes employ structures for supporting the part being manufactured. The support structures are often customized to the part.

SUMMARY OF THE INVENTION

In one aspect, the invention features an electroplating method that includes: a) contacting a first substrate with a first article, which includes a substrate and a conformable mask disposed in a pattern on the substrate; b) electroplating a first metal from a source of metal ions onto the first substrate in a first pattern, the first pattern corresponding to the complement of the conformable mask pattern; and c) removing the first article from the first substrate.

In preferred embodiments, the method further includes electroplating a second metal from a second metal ion source onto the first substrate. In one embodiment, the step of electroplating the second metal includes: a) contacting the first substrate with a second article including a substrate and a conformable mask disposed in a pattern on the substrate; b) electroplating a second metal onto the first substrate in a second pattern, the second pattern corresponding to the complement of the conformable mask pattern of the second article; and c) removing the second article from the first substrate. The method can further include building additional layers.

In one embodiment, the invention features an electroplating method that includes repeatedly contacting a substrate with a patterned conformable mask; electroplating a first metal form a source of ions onto the substrate in a pattern, the pattern corresponding to the complement of the conformable mask pattern; and removing the mask from the substrate.

In another embodiment, the invention features a method for manufacturing an element that includes forming a multilayer structure by repeatedly forming layers according to the above-described electroplating methods.

In another aspect, the invention features an electroplating article that includes a substrate having a first major surface and a conformable mask disposed in a pattern on the first major surface of the substrate. The article is capable of electroplating a pattern of metal complementary to the pattern of the conformable mask onto an electrode when the article is placed in contact with the electrode in the presence of a metal ion source and subjected to an electric field.

In other aspects, the invention features an electroplating apparatus that includes an electrolyte, which includes ions of a first metal and ions of a second metal, an anode in contact with the electrolyte, a cathode in contact with the electrolyte, and a first article (e.g., the above described electroplating article) in contact with the electrolyte.

In one embodiment, the electroplating apparatus includes a first electroplating reservoir that includes an electrolyte, which includes a first metal ion, disposed within the first reservoir, an anode in contact with the electrolyte, a cathode in contact with the electrolyte, and an article (e.g., an article described above) in contact with the electrolyte; a second electroplating reservoir that includes an electrolyte, which includes ions of a second metal, disposed within the second reservoir, and an anode in contact with the electrolyte.

In another aspect, the invention features a method for manufacturing an electroplating article. The method includes: a) applying a conformable mask to an article comprising a first substrate and a patterned resist disposed on the first substrate; b) contacting a second substrate to said conformable mask such that the conformable mask obtains a pattern complementary to the resist pattern; c) separating the first substrate from the conformable mask (the conformable mask remaining adhered to the article); and d) removing the resist.

In one embodiment, the method for manufacturing an electroplating article includes providing a porous medium having a first surface; b) treating said porous medium to create one or more nonporous regions; c) applying a film to said first surface of said porous medium; d) patterning the film to create a patterned mask; and e) removing at least a portion of the one or more nonporous regions.

In other aspects, the present invention is directed to the calculation, storage and retrieval of cross section geometry of a three dimensional object for generation of patterned masks reflecting that geometry and for use in an electroplating method. The data and control processes of various embodiments of the invention can be implemented by a software application program executed in a general purpose computing system.

The data and control processes of various embodiments of the invention can be embodied in an electroplating method implemented via the application program and also in an article of manufacture, in the form of a data storage medium that stores application program code arranged to carry out that method upon execution by a processor.

The electroplating methods and articles allow fabrication of devices from thin layers of materials such as, e.g., metals, polymers, ceramics, and semiconductor materials. The electroplating methods produce relatively homogeneous, isotropic elements (e.g., devices) without interlayer junctions. The electroplating methods can be performed at low temperatures, thus allowing substrates such as integrated circuits and silicon wafers to be used as plating substrates.

The electroplating methods of various embodiments of the invention can be used to fabricate devices of freeform geometry including high aspect ratio devices, hollow devices with internal features, devices with cantilevered and "chandelier" geometries, and functional assemblies of interconnected, stationary or moving parts (i.e., devices fabricated in an assembled state). The electroplating articles, apparatus, and methods also are particularly useful in mass production of devices.

Other features and advantages of various aspects of the invention will be apparent from the following description of the preferred embodiments thereof, and from the claims.

BRIEF DESCRIPTION OF THE DRAWINGS

FIGS. 6a-6d are diagrams of a fourth embodiment of a method for forming an electroplating article;

FIGS. 7a-7f are diagrams of a fifth embodiment of a method for forming an electroplating article;

FIGS. 8a-8e are diagrams of a sixth embodiment of a method for forming an electroplating article;

FIGS. 9a-9c are diagrams of a seventh embodiment of a method for forming an electroplating article;

FIGS. 10a-10c are diagrams of a method for forming a deposit according to an electroplating method of an embodiment of the invention;

FIGS. 12a-12c are diagrams of a method according to the electroplating method of an embodiment of the invention;

FIGS. 13a-13i are diagrams of a method for fabricating an element on an integrated circuit;

FIGS. 14a-14e are diagrams of a method for assembling elements fabricated together;

FIGS. 15a-15b are diagrams of an element manufactured according to the electroplating method of an embodiment of the invention;

DESCRIPTION OF THE PREFERRED EMBODIMENTS

Figure 1:
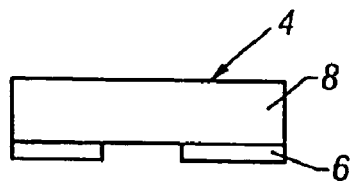
FIG. 1 is view taken in cross section of an electroplating article according to one embodiment of the invention.

The embodiments feature electroplating methods, apparatus and articles that enable the manufacture of elements having complex structures. The electroplating methods include selective electroplating of layers that may include both structural materials (e.g., metals) and support (i.e., sacrificial) materials; and subsequent removal (e.g., by etching, melting, or electrolytically dissolving) of the support materials. The structural material remaining after removal of the support material defines an element such as a microscopic or mesoscopic device. The electroplating methods employ electroplating articles that include a patterned conformable mask, optionally adhered to a support such as an electrode or a porous medium.

In general, various embodiments of the invention feature electroplating articles for use in electroplating methods. The electroplating method occurs in an electroplating apparatus that includes an electroplating bath filled with electrolyte, an anode, and a cathode. The electrolyte contains metal ions and, optionally, other additives. The anode can be part of the electroplating article, as described below, or can be located at a distance from the article. Throughout this application, the substrate to be plated functions as the cathode unless otherwise specified. To simplify the description, the materials are referred to as metals and similar features are indicated with the same reference numerals.

Electroplating Article

Figure 2:
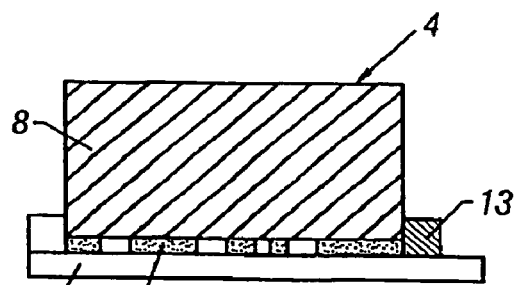
FIG. 2 is a view taken in cross section of an electroplating article according to a second embodiment of the invention.

Referring to FIG. 1, electroplating article 4, of a preferred embodiment of the invention includes a patterned conformable mask 6 adhered to a support 8. The electroplating article can also be only a patterned conformable mask (i.e. without a support). The support can be a porous medium (e.g., a filter), an anode, and combinations thereof. The article can include a plurality of different mask patterns on a single support. The different mask patterns can be contacted by a substrate in a predetermined sequence to sequentially plate a plurality of metal layers where each metal layer has a pattern corresponding to the complement of the mask pattern contacted, to form a multi-layered element. Referring to FIG. 2, electroplating article 4 can include one or more edge masks 13 on the outer surface of the article, for confining the metal being plated.

Contact between the electroplating article and the substrate to be plated is made by pressing the patterned mask against the substrate using a well-controlled, uniform pressure. The appropriate masking pressure will prevent flash (i.e., the deposition of metal in the area covered by the mask), and will prevent distortion of the features defined by the mask. When the electroplating article is removed from contact with the substrate, the mask remains adhered to the support and thus remains part of the electroplating article.

A variety of methods can be used to improve release of the mask from the substrate to be plated so as to prevent delamination of the mask from the support: for example, gradually peeling the electroplating article (if flexible) off of the substrate optionally with the aid of a dull blade; adding a non-stick/lubricating compound to the electrolyte; coating the mask surface with a non-stick composition (e.g., sputtered polytetrafluoroethylene); and vibration (e.g., ultrasound).

Patterned Conformable Mask

The patterned conformable mask is sufficiently deformable (e.g., elastically deformable) to permit conformance of the mask to the surface of a substrate to be plated to maximize contact between the mask and the substrate, and to minimize (preferably eliminate) the presence of gaps between the mask and the substrate. Maximizing contact between the mask and the substrate minimizes the potential for flash formation. The mask is also sufficiently durable to enable repeated use (i.e., contacting with and removing from a substrate). The mask is sufficiently rigid and thin to prevent distortion of the mask features (i.e., the positive and negative features constituting the closed and open features of the mask pattern respectively) by the masking pressure. The mask preferably is relatively thick compared to its peak and valley roughness and the curvature of the substrate to be plated.

The mask preferably exhibits very high volume electrical resistivity (e.g., $10^{14}$ Ohm-cm), has a very low permeability to ions in the electrolyte solution, and is chemically non-reactive with the plating electrolytes at the temperatures at which the plating operation is conducted. The mask can be hydrophilic or hydrophobic, with hydrophilic being preferred. In the case of hydrophobic materials, relatively higher amounts of wetting agents can be included in the electrolyte to ensure wetting of the mask material.

The mask preferably is capable of forming a strong bond (e.g., a chemical or mechanical bond) to the support, such that small (e.g., 15×15 μm) isolated positive features are not delaminated by the mask fabrication process, normal handling of the mask or by removal of the mask material from the substrate to be plated.

The patterned mask is preferably substantially planar and smooth to enable conformance to the substrate to be plated. The mask is capable of being patterned with negative and positive features of varying dimensions (e.g., 10-25 um or smaller, such as submicron), preferably with no mask residue blocking the negative features of the mask pattern. The pattern of the mask includes apertures (i.e., negative features) extending through the mask thickness and defined by one or more sidewalls of the mask. The mask features preferably have a substantially planar wall profile and may have a slight wall angle. The wall angle may be slightly divergent toward the substrate to be plated, i.e. the negative features are slightly larger at the substrate than at the support. Such wall angles may aid in separating the mask from the substrate and may aid in facilitating re-contacting the mask to the substrate in the presence of an existing deposit.

The mask can be compound so as to include more than one layer of material, e.g., a relatively rigid layer (e.g., a high aspect ratio photoresist, e.g., SU-8 commercially available from MicroChem Corporation or synchrotron-processed polymethylmethacrylate), and a conformable layer. Another example of a useful rigid layer is a positive photoresist such as Clariant AZ4620, which can be patterned by exposing it to ultraviolet light through the patterned conformable layer.

Examples of useful masking compositions for conformable portions of the mask include elastomers such as, e.g., polydimethylsiloxane (i.e., silicone rubber) commercially available, e.g., under the trade designation Sylgard from Dow-Corning (e.g., Sylgard 182 and 184), and under the trade designation RMS-033 from Gelest. The masking compositions can include other additives, e.g., photoinitiators, fillers, and hydrogen getters.

Porous Medium

The porous medium has interconnected pores and is permeable to ions and additives present in electrolyte compositions. The porous medium can have one or more layers of varying porosity. The porous medium preferably has a pore size considerably finer than the minimum negative feature of the mask. The pores are preferably uniform in open area, e.g., the open area of any 20 μm square of the medium is consistent to 1%. Particularly useful porous mediums may be porous mediums that are useful as filters, and particularly those that have a particle retention rating in the range of 0.3-3 μm. For those porous mediums that include multiple porous layers, each porous layer can vary in porosity and pore size, with the porous medium in closest proximity to the substrate to be plated exhibiting the above characteristics. The surfaces of the porous medium that contact the mask should be sufficiently flat and smooth to ensure that the surface of the adhered mask that contacts the substrate to be plated is also flat and smooth.

The porous medium is chemically non-reactive with the electrolyte solution at the operating temperature of the electrolyte bath. Preferred porous mediums are hydrophilic. The porous medium preferably is permeable to gas to allow venting of gas bubbles generated during the electroplating method.

Preferably the porous medium is free from shedding (i.e., does not release portions of itself into surrounding fluid), and is sufficiently durable so as to withstand multiple electroplating operations. Examples of suitable porous medium materials include rigid, hydrophilic, slip cast ceramic disk porous mediums (commercially available from Coors Ceramics) and hydrophilized membrane porous mediums made from, e.g., polypropylene (commercially available under the trade designation GH from Gelman), polyvinylidenefluoride (commercially available under the trade designation Durapore from Millipore) and polytetrafluoroethylene (commercially available under the trade designation LCR from Millipore). Rigid porous mediums can provide masking pressure when supported by their edges alone.

Particularly useful highly permeable, porous mediums include relatively thin, flexible, porous membranes. Porous membranes can be combined with a more rigid porous medium, which serves as a backing to provide the requisite pressure for masking applications. The porous membrane can be sandwiched between the more rigid porous medium and the mask and the porous medium can be used to supply the requisite masking pressure for the plating operation. The more rigid porous medium can have a relatively more coarse (i.e., larger) porosity than that useful for direct contact with the mask. Porous membranes can be integrated with the mask composition (or transformed into a mask).

To assist handling, porous membranes can be installed in the drumhead fixture described below, or temporarily adhered to a rigid flat substrate (e.g., a silicone wafer, glass) with an adhesive composition (e.g., dry film photoresist). Porous membranes can be processed while adhered to the substrate and, after processing, removed by dissolving the adhesive.

Masking pressure can be applied to the porous membrane by the momentum of a stream or jet of electrolyte impinging on the membrane from behind, optionally in combination with dense particles incorporated into the electrolyte, and increasing the viscosity of the electrolyte, for example, by the addition of a polymer. Masking pressure can also be applied to the membrane by sealing the membrane against the walls of the tank of the electroplating system and then pressurizing the electrolyte, causing the membrane to be pushed against the substrate to be plated. A dummy substrate can be used when the substrate to be plated is smaller than the porous medium to prevent the membrane from bulging.

One example of an electroplating method that employs a porous membrane includes pressing a relatively more rigid porous medium against the membrane, applying current, depositing a metal for a period, removing the current, withdrawing the rigid porous medium from contact with the membrane, slightly displacing the relatively more rigid porous medium in its own plane (e.g., in an orbital or linear fashion), and repeating the cycle. Displacing the relatively more rigid porous medium during each cycle allows a different portion of the rigid porous medium to make contact with the membrane. Preferably the mask/membrane separates from the substrate to be plated while the relatively more rigid porous medium is separated from the membrane so as to allow exchange of fluids between the microvolume and bulk electrolyte.

Another membrane plating method includes pressing a granular medium, tiny spheres, or rollers against the membrane using, e.g., a rigid screen. The tiny spheres and rollers can be rotated in a pattern (e.g., a linear pattern using linear movement or a circular pattern using an orbital movement) on the membrane continuously or intermittently so as to average the local non-uniformities in pore structure of the rollers/spheres. Preferably the amplitude of movement is equal to (more preferably several times greater than) the diameter of the sphere or cylinder. Preferably the spheres/cylinders are relatively small and the membrane is relatively thick. The spheres/cylinders can be made of the metal being plated.

Anode

The electroplating article can consist of a patterned mask on an anode. The anode can be soluble or insoluble, rigid or flexible, porous or nonporous, and can include an erodable layer (e.g., a metal layer) supported by a conductive material that does not erode (e.g., platinized titanium). The anode can be of any dimension including a thin flexible sheet of metal.

A soluble anode will tend to erode during use. The anode can be "redressed" periodically by reversing the polarity of the anode and plating metal back onto the anode through the negative features of the mask. The excess metal is supplied by the electrolyte in conjunction with another anode according to, e.g., through-mask plating processes used in electronics manufacturing. For a system in which the mask is physically supported by and attached to a porous medium, and an anode is located directly behind the membrane, moving the anode will prevent localized erosion of the anode.

Forming Electroplating Articles

In general, methods for forming electroplating articles include applying a solid mask or liquid masking composition to a support, i.e., an anode, a porous medium and combinations thereof. The solid mask can be patterned prior or subsequent to attachment to the support. Liquid masking compositions can be patterned on a non-porous substrate (e.g., inert material, or a material that can be dissolved or melted (e.g., substrates of plastic, lacquer, or low melting point alloy)), cured (e.g., crosslinked, polymerized, hardened, solidified, gelled, and combinations thereof), and attached to a support or patterned and solidified directly on the support.

Preparation of the Support

It is preferable to planarize the surface of the support that will receive the mask, so as to provide a smooth flat surface for receiving the mask. When applying the mask to an anode, it is preferable to first prepare the anode surface so as to maximize adhesion to the mask. Examples of useful anode surface preparation methods include chemical microetching, lapping, sandblasting, and sintering a thin layer of powder onto the surface. A chemical adhesion promoter (e.g., Sylgard Prime Coat) can also be used.

A variety of methods can be used to maintain or improve adhesion of the mask to a porous medium. These methods include melting the mask while pressing it into the porous medium resulting in a mechanical interlocking of the mask with the porosity of the porous medium, and applying an adhesive composition between the mask and the porous medium. Adhesion of the mask to the porous medium can also be enhanced by employing an adhesive that is a meltable material (e.g., glass), which can be dry deposited (e.g., sputtered) onto the surface of the patterned mask. When using an adhesive composition, it is preferable to employ methods that confine the adhesive composition to the areas located between the mask and the support (e.g., preventing the adhesive from bridging a negative feature that is only a few microns wide).

Liquid masking compositions have a tendency to soak into (i.e., uncontrollably absorb into) the pores of a porous medium. A variety of methods can be employed to reduce "soak in" in regions of the porous medium that are to remain porous. Examples of suitable methods for preventing soak in include: (1) supplying pressurized air to one side of the porous medium; (2) treating the porous medium with a temporary filler composition that soaks in and fills the pores and then solidifies to form a barrier to penetration of the liquid masking composition; and (3) treating the porous medium with a temporary filler composition that is immiscible with and denser than the liquid masking composition. The surface of the porous medium can be abraded after infiltrating the pores with filler composition to expose uncoated and unfilled surfaces allowing direct adhesion of the mask to the support. The filler composition can be dissolved or otherwise removed from the porous medium after the liquid masking composition has been cured to a solid.

Examples of useful filler compositions include acetone-soluble waxes and lacquers, soluble waxes used for investment casting cores, water soluble salts, gels, Crystal Bond 509, soluble thermoplastics, and phase-change materials (e.g., ice, electrorheological fluids).

Figure 3A:
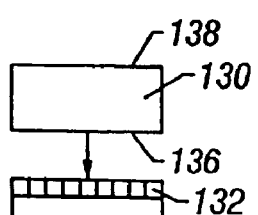
FIGS. 3a-3d are diagrams of a first embodiment of a method for forming an electroplating article.
Figure 3B:
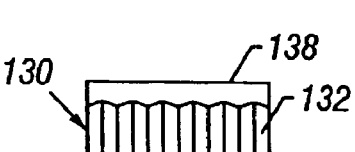
Figure 3C:
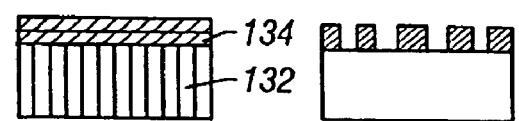
Figure 3D:

Referring to FIGS. 3a-3d, one example of a method for rendering a porous medium temporarily nonporous using a filler composition includes: spinning a thin layer of a liquid filler composition 132 onto a relatively flat surface 131 (e.g., a silicon wafer) (preferably the thickness of the filler composition layer is adjusted so as to fill the pores of the porous medium to a predetermined height); contacting a first surface 136 of porous medium 130 to the spun-on filler composition 132 (FIG. 3a); allowing filler composition 132 to seep into the pores of the porous medium to a predetermined height (FIG. 3b); solidifying the filler composition 132; and applying (e.g., by spinning on) a sufficient amount of liquid masking composition 134 to a second surface 138 of the porous medium 130 opposite the first surface 136 through which filler composition 132 entered the porous medium 130. Liquid masking composition 134 is applied so as to produce a layer of masking composition of desired thickness on the surface of the porous medium. The remainder of the liquid masking composition 134 can seep into the porous medium (for purposes of adhesion) only to the surface of the solidified filler 132 (FIG. 3c). The method further includes curing the masking composition 134; removing solidified filler 132; etching the negative features of the mask through the layer of porous medium 130 that is saturated with masking composition 134 to at least a depth at which the solidified filler 134 existed (FIG. 3d).

Other methods for preventing or limiting soak in include restricting the volume of liquid masking composition that is applied to the porous medium to only a fraction of the pore volume in the porous medium causing the liquid to only partially fill the pores. One such method includes spraying a liquid masking composition onto the porous medium, while carefully controlling the flow rate and speed of the spray pattern. Another method involves spin coating the liquid masking composition onto a non-absorbing sheet to obtain a uniform thin layer, and placing the porous medium in contact with the spun on liquid masking composition. When the porous medium is peeled away from the sheet or the sheet is dissolved or melted, a thin coating of masking composition is transferred to the porous medium (i.e., the masking composition remains adhered to the porous medium). The liquid masking composition can be cured prior to or subsequent to removal of the sheet.

Another method for preventing soak in involves applying the liquid masking composition to a porous medium while the porous medium is spinning at high speed; the centrifugal forces spread the masking composition into a thin layer before it has had time to soak in excessively.

Another approach to preventing soak in involves forming a barrier layer at or near the surface of the porous medium. After processing, the barrier layer (and optionally, some of the porous medium) is removed from the negative features of the mask, so as to expose the porosity of the porous medium. Optionally, to improve adhesion of the mask to the support, the regions of the barrier layer that will correspond to the positive features of the mask can be removed prior to application of the mask. The barrier layer can be removed using various techniques including, e.g., chemical etching, dry etching, ion milling, laser machining, and melting (e.g., for thermoplastic based barriers). The barrier layer can also be formed by applying another material to the surface of the porous substrate, e.g., (1) by laminating a film of a solid material, such as dry film photoresist onto the porous medium; (2) by applying a liquid barrier layer, preferably of high viscosity, using one of the techniques discussed above that restrict soak-in volume; (3) by coating the porous medium with a thin layer of powder and melting the powder layer so as to form a non-porous coating; (4) by depositing a barrier film by vacuum evaporation, sputtering, CVD, or other process; and (5) by using combinations thereof.

In the case of a porous anode, soak in can be prevented using a variety of methods which include, for example, (1) applying a nonporous layer to the surface of the porous anode and, after patterning the mask, removing the nonporous layer in the negative areas of the mask to expose the anode; (2) sintering a partly-compacted powder of anode material in a mold to create a sintered anode with an outer non-porous layer, patterning the mask from a masking material that is applied over the sintered material, and immersing the structure in an etchant that attacks the metal of the anode, such that the outer non-porous layer of sintered anode material is dissolved (in the unmasked regions); (3) melting the surface of the anode (e.g., by flame, or contact with a hot surface), then patterning the mask and removing the melted surface material to expose the porous anode material in unmasked regions; and (4) temporarily filling the surface pores with a material, e.g., metal electrodeposited onto the porous surface, then patterning the mask and removing the temporary filler material to expose the porous anode material in unmasked regions.

Patterning and Fabricating the Electroplating Article

Figure 4A:
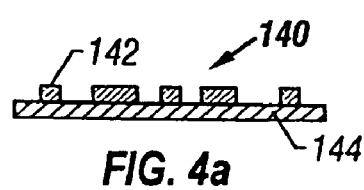
FIGS. 4a-4e are diagrams of a second embodiment of a method for forming an electroplating article.

A variety of methods can be used to pattern the electroplating article. Referring to FIGS. 4a-4e, an example of a method for forming an electroplating article is shown. The method includes forming a micromold 140 by coating (e.g., by spinning) a layer of resist 142 (e.g., photoresist commercially available under the trade designation SU-8 5 from MicroChem Corp.) onto a substrate 144 (e.g., a silicon wafer) (FIG. 4a). Preferably the layer of photoresist has a thickness a few microns greater than that of the desired thickness of the final mask. The photoresist can be patterned using a photomask and a light source (e.g., a UV light source). A positive feature of the resist corresponds to a negative feature of the mask. Optionally, the micromold can be made from a non-stick material such as polytetrafluoroethylene or polypropylene, and can include a pattern formed, e.g., by reactive ion etching or excimer ablation, or micromolded from a master mold according to processes similar to processes used in the fabrication of compact disks.

Figure 4B:
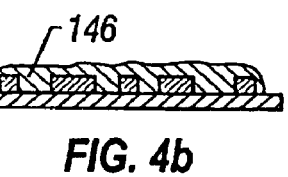
Figure 4C:
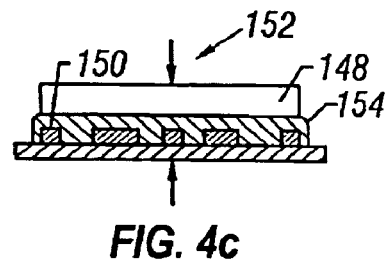

The micromold surface including the photoresist and the substrate can be passivated by allowing the micromold to be exposed to vapors of, e.g., (tridecafluoro-1,1,2,2,-tetrahydrooctyl)-1-trichlorosilane (commercially available from United Chemical Technologies). A liquid masking composition 146 is then poured over the raised pattern defined by the patterned photoresist (FIG. 4b). Support 148 is then pressed against micromold 140 (FIG. 4c). Uniform pressure is applied such that liquid masking composition 146 is forced out of the area 150 located between the raised portions (i.e., positive features) of the resist pattern and the surface of support 148. Preferably, liquid masking composition 146 is completely squeezed out of the areas 150 corresponding to the positive features of resist 142. The entire assembly 152 remains in this mating relationship until the liquid masking composition has cured. For a heat-curable masking composition, the assembly can be transferred to an oven to cure.

Figure 4D:
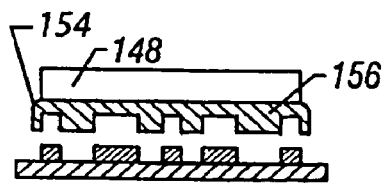
Figure 4E:
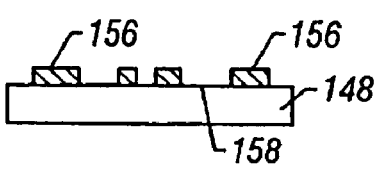

In the case of a mask that has been cured in the oven, the assembly is quickly disassembled to minimize differential thermal contraction between support and the mold. The support and cured mask 156 is pulled away from mold 140 such that cured mask 156 detaches from micromold 140, yet remains adhered to support 148 (FIG. 4d). Mask 156 exhibits a pattern inverse to that of micromold 140. Micromold 140 can be reused. After cure, before or after detachment of the mask and mold, excess mask material 154 surrounding support 148 is removed as illustrated in FIG. 4e. If necessary, micromold 140 can be cleaned to remove mask residue. One example of a useful silicone cleaning composition is a silicone stripper, e.g., Amtex CCR (commercially available from Amtex Chemical Corp.).

Any residual layer of masking composition remaining in negative features 158 of mask 156 (FIG. 4d) can be removed using dry etching (e.g., RIE with a mixture of O2 and CF4 gas), which may also reduce the thickness of the positive features of the mask. The result of such removal is depicted in FIG. 4e. Uniform etching extending to the edge of the support can be accomplished by surrounding the support with a "dummy" substrate preferably of similar composition, such that non-uniformities due to edge effects are out of the area of interest.

When the mask is adhered to a porous medium, the etch may be continued to remove any barrier layer present in the porous medium from the negative features of the mask and may be continued until a porous portion of the porous substrate is removed. If pores in a porous medium have been filled or are non-existent, the pores are re-established or established, e.g., by reactive ion etching.

Figure 5A:
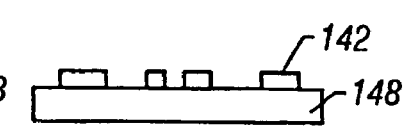
FIGS. 5a-5e are diagrams of a third embodiment of a method for forming an electroplating article.
Figure 5B:
Figure 5C:
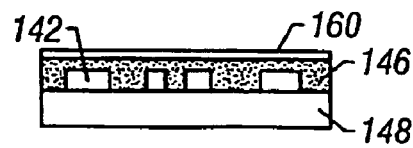
Figure 5D:
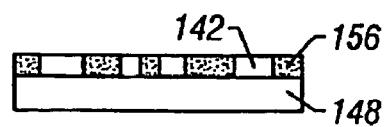
Figure 5E:

Another method for forming an electroplating article is shown in FIGS. 5a-5e. The method includes patterning a photoresist 142 onto a support 148 (i.e., the porous medium or the prepared anode) to the approximate thickness desired for the final mask (FIG. 5a). The areas of support 148 occupied by resist 142 correspond to negative features of the mask through which metal can be deposited. When patterning a porous medium that includes a barrier, the porous medium can be etched to remove the barrier layer from those areas of the porous medium that are not covered by resist. The method further includes applying a liquid masking composition 146 to support 148 (FIG. 5b), and optionally vacuum degassing the masking composition. A flat, smooth, non-stick (e.g., PTFE) sheet 160 is then pressed against resist 142, and liquid masking composition 146 parallel to support 148 (FIG. 5c), and pressure is applied to squeeze the liquid masking composition 146 out from between resist 142 and sheet 160. Masking composition 146 is then cured, sheet 160 is removed, and residual masking composition overlaying the resist is removed (FIG. 5d), e.g., by etching (e.g., reactive ionization etching using a mixture of O2 and CF4 gas). Resist 142 is then removed to expose areas of the support previously occupied by the resist (FIG. 5e). When patterning a porous medium, mask material that has seeped into the negative features of the mask from neighboring positive features can be removed by etching both mask and porous medium to the required depth. If pores of the porous medium have been filled or are non-existent, the pores can be established or re-established.

Figures 6A, 6B, 6C:
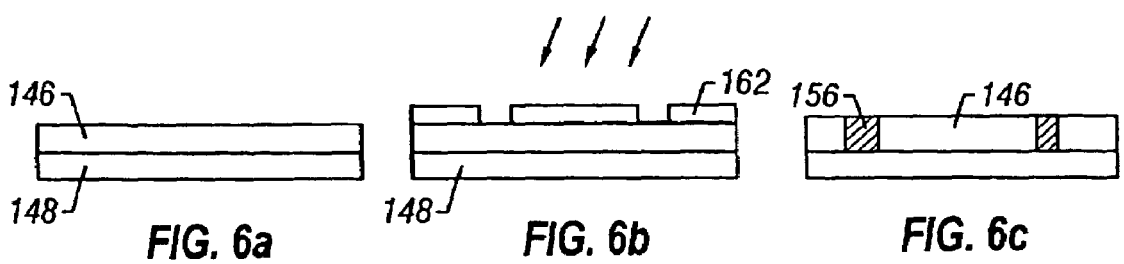
Figures 6D, 7A:
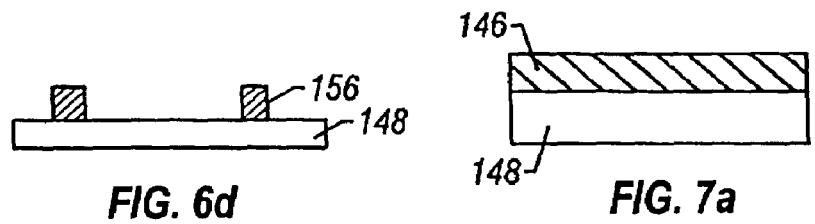

Referring to FIGS. 6a-6d, another method for forming an electroplating article includes applying (e.g., by spinning on) a layer of photopatternable liquid masking composition 146, e.g., RMS-O33 (commercially available from Gelest) in combination with a photoinitiator (e.g., 2,2-dimethoxy-2-phenyl acetophenone (commercially available from Polysciences, Inc.)), to support 148 (FIG. 6a). Liquid masking composition 146 can be covered with a thin, oxygen-impermeable film (e.g., Mylar) to protect the composition from contact with oxygen. Masking composition 146 is then exposed to patterned light (e.g., UV light transmitted through a photomask 162) to selectively cure the mask composition (FIG. 6b). The film is removed (FIG. 6c) and the photopatternable masking composition is developed (e.g., by dissolving with xylene) removing uncured masking composition 146 (FIG. 6d). If a nonporous barrier layer exists, it is removed (e.g., by dry etching) from the negative features of mask 156. Pores are established if necessary. For those photopatternable masking compositions that are negative working the porous medium can be completely saturated with masking composition until there is a surface layer of masking composition having the desired thickness. After photopatterning, the unexposed masking composition material (including that in the pores) is dissolved in the developer.

When patterning a porous medium, the porous medium can be tinted a dark shade or coated with an antireflection composition to reduce the amount of light scattered from the textured surface.

Figures 7B, 7C:
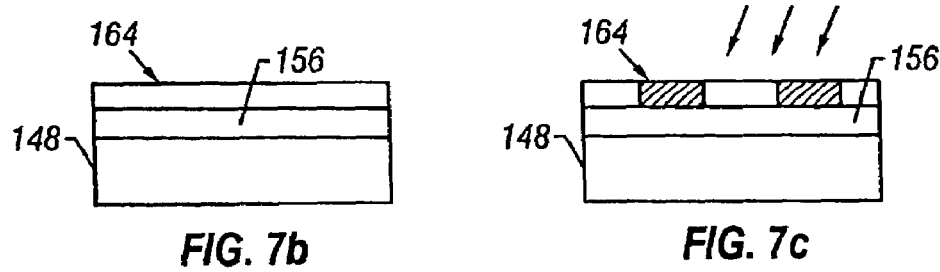
Figures 7D, 7E:
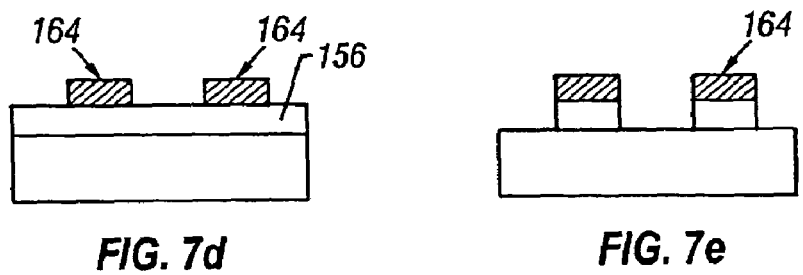
Figures 7F, 8A:
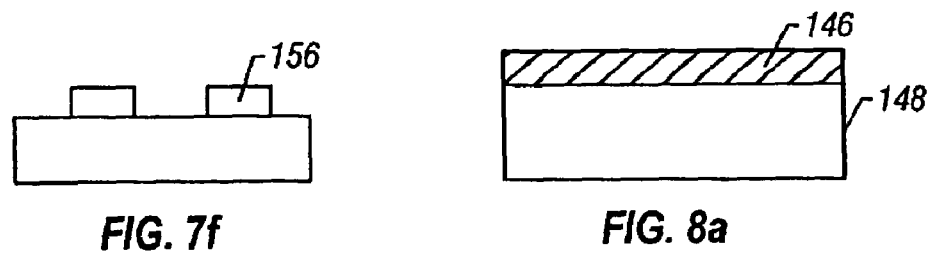

Referring to FIGS. 7a-7f, another method for making an electroplating article is shown. The method includes applying a liquid masking composition 146 (or a solid mask material) to support 148 (FIG. 7a); curing liquid masking composition to form an unpatterned solidified mask 156; coating unpatterned mask 156 with either a thick resist 164 or a thin resist disposed on a thin metal layer (not shown) (FIG. 7b); patterning resist 164 and, in the case of a metal layer, using the patterned resist to pattern the metal layer (e.g., by etching or lift-off) (FIGS. 7c and 7d); selectively removing (e.g. by wet etch, dry etch, or ion mill) portions of unpatterned mask 156 to form a patterned mask 156 using thick resist 164 (and metal layer if present) as a mask (FIG. 7e); and in the case where the substrate is a porous medium, preferably removing the top layer of the porous medium to open pores; and removing, e.g., by stripping, the remaining resist 16a (and metal layer if used) (FIG. 7f).

Figures 8B, 8C:
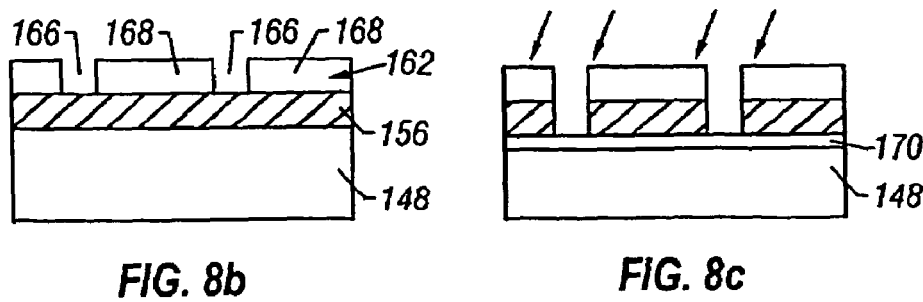

Referring to FIGS. 8a-8c, a method for forming an electroplating article is shown which includes: applying a liquid masking composition 146 (or a solid mask material) to support 148 to the desired, thickness; curing (if liquid) the masking composition to form solidified unpatterned mask 156 (FIG. 8a); applying a photomask 162 over the mask 156 (FIG. 8b) where the photomask has light apertures 166 and light barriers 168; exposing solid mask 156 to patterned ultraviolet light through the photomask 162 (FIG. 8c), the UV light having an intensity and wavelength suitable for ablating the mask and support material, e.g., a LTV excimer laser beam; ablating mask 156 until support 148 is exposed (FIG. 8c); and, when patterning a porous medium, ablating barrier layer 170, if present (FIG. 8d) and, if necessary, the top layer of the porous medium to open pores; and removing the photomask to form the electroplating article 172 (FIG. 8e).

Methods similar to methods used in relief printing can also be used to fabricate electroplating articles. One example of such a method includes: applying a liquid masking composition to a relief pattern, which might be produced by patterning a high aspect ratio photoresist such as AZ4620 or SU-8; pressing the relief pattern/masking composition structure against a support such that the masking composition adheres to the support; and removing the relief pattern. The formed electroplating article includes a support having a mask patterned with the inverse pattern of the relief pattern.

Another example of such a method includes: creating a relief pattern on the support by etching of the support, or by applying a durable photoresist, e.g., SU-8 of desired configuration; coating a flat, smooth sheet with a thin, uniform layer of liquid masking composition; stamping the support/resist against the coated sheet (e.g., like a stamp and inkpad) to quickly mate those portions of the liquid composition to the positive features of the support/resist by unmating them from the smooth sheet (preferably the support and the sheet are kept parallel); and curing the liquid masking composition.

Referring to FIGS. 9a-9c, a method for forming an electroplating article is shown in which a surface layer of porous medium 148 is saturated with a liquid masking composition to the thickness of the desired mask. Liquid masking composition is solidified producing a matrix 174 of solid mask 156 and porous medium 148. Matrix 174 is then patterned, e.g., by etching or ablating selected areas of the matrix to a depth at least equal to the depth of the matrix "layer", to form electroplating article 176. Alternately, the method can include saturating the entire porous medium with liquid masking composition, pattern curing the liquid masking composition, and removing the uncured masking composition.

Other methods of forming electroplating articles include, e.g., applying masking composition selectively to a support by such processes as screen printing, stencil printing and inkjet printing; and for porous mediums, melting a surface layer of the porous medium and forming negative features in the surface of the porous medium by etching/ablating through the melted layer to expose the pores of the porous medium and generate a relief pattern. The methods for forming electroplating articles can also include etching the negative features (i.e., windows) of the mask pattern to increase the amount of relief on the electroplating article. In the case of a porous medium and a printed silicone mask, etching can be conducted by an oxygen plasma.

The Electroplating Method

In general, select embodiments of the invention features electroplating methods that include contacting a substrate to be plated with an electroplating article; selectively electroplating a first metal, e.g., a support or sacrificial metal; and electroplating a second metal, e.g., a structural metal. The step of electroplating a second metal can include selectively electroplating the second metal using an electroplating article or blanket depositing the second metal. The electroplating method can be used to plate a single layer of metal or the method can be repeated such that additional metal is plated onto previously plated metal layers producing a multi-layered structure. After a predetermined number of layer(s) have been plated, at least a portion of the support metal can be removed, e.g., by etching. The structural metal that remains defines a microscopic or mesoscopic device.

The method can also employ two electroplating articles to plate a single layer of one metal. Referring to FIGS. 10a-10c, a first metal is plated in a first pattern 230 (FIG. 10a), the same metal is then plated in second pattern 232 (FIG. 10b), to form plated metal layer 234 (FIG. 10c). Second pattern 232 may overlap first pattern 230.

Figure 11A:
FIGS. 11a-11m are diagrams of a method according to the electroplating method of an embodiment of the invention.
Figure 11B:
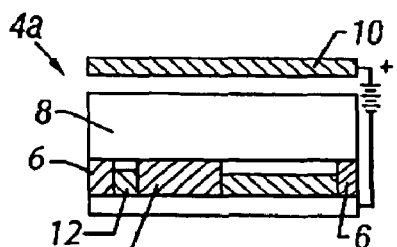
Figure 11C:
Figure 11D:
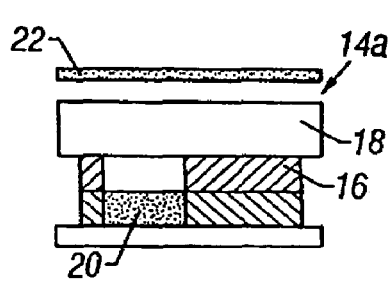
Figure 11E:
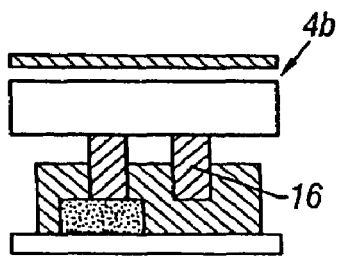
Figure 11F:
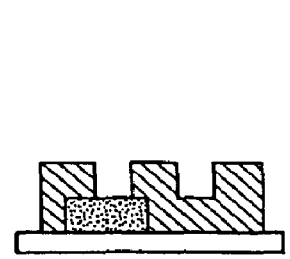
Figure 11G:
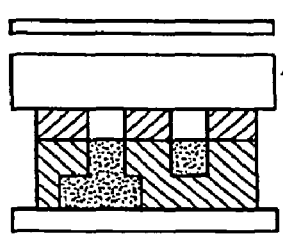
Figure 11H:
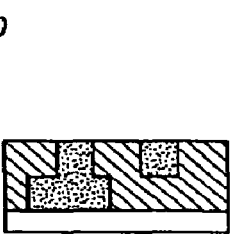
Figure 11I:
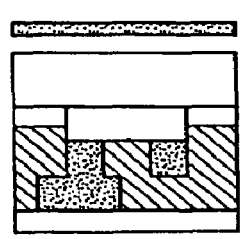
Figure 11J:
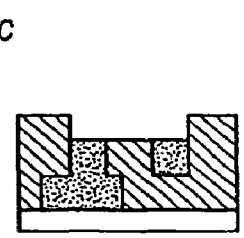
Figure 11K:
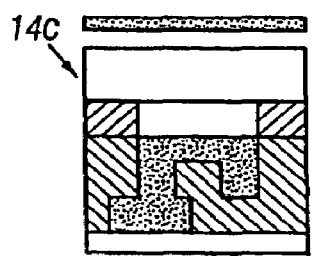
Figure 11L:
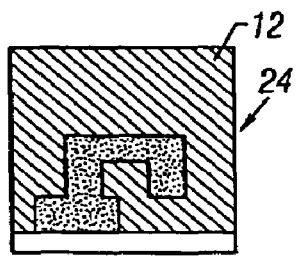
Figure 11M:
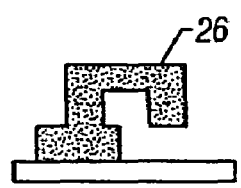

One example of an electroplating method of an embodiment of the invention is shown in FIGS. 11a-11m. The method includes contacting a substrate to be plated 2 (FIG. 11a) with first article 4a, which includes mask 6 and support 8 (FIG. 11b), in the presence of a first metal ion source (i.e., electrolyte and anode 10); depositing a first metal 12 (FIGS. 11b and 11c), e.g., a sacrificial metal; contacting substrate 2 with a second article 14a, which includes mask 16 and a support 18, depositing a second metal 20, e.g., a structural metal, in the presence of a second metal ion source (i.e., electrolyte and anode 22) (FIG. 11d; optionally planarizing the layer; and repeating this method using differently patterned electroplating articles 4b, 4c, 14b, 14c (FIGS. 11e-11k) to produce multi-layered structure 24 (FIG. 11l), which, after etching all of sacrificial metal 12, becomes element 26 (FIG. 11m). The second article can include a mask that has oversized positive features such that the surface area of one or more positive features of the mask extends beyond the corresponding surface area of the first plated metal.

The element formed during the electroplating method can remain attached to the substrate or can be removed from the substrate. One method for removing the element includes plating a first layer of support material onto the substrate such that etching removes the source of attachment of the element to the substrate.

Another electroplating method is depicted in FIGS. 12a-12c. The electroplating method includes: contacting a substrate to be plated 2 with an electroplating article (not shown); selectively depositing a first metal 12 (i.e., either the structural or the support metal) (FIG. 12a); blanket depositing a second metal 20 (FIG. 12b), and mechanically planarizing the deposited layer to achieve a flat, smooth layer 28 of precise thickness (FIG. 12c). The planarized surface can be rinsed to remove abrasive particles present on the surface. Preferably the support metal is selectively plated and the structural metal is blanket deposited.

Examples of useful planarization methods include mechanical (e.g., diamond lapping and silicon carbide lapping), chemical-mechanical, and non-mechanical (e.g., electrical discharge machining), planarization processes. Diamond lapping is a particularly preferred planarization process. Diamond lapping can be performed using a single grade of diamond abrasive, e.g., about 1-6 micron, or diamond abrasives of various grades. Lapping with different grades of abrasive can be performed using separate lapping plates, or in different regions of a single plate. For example, a coarse diamond abrasive can be applied to the outer region of a spinning circular lapping plate, and a fine diamond abrasive can be applied to the inner region. A removable circular wall can be provided between the inner and outer regions to increase segregation. The layer to be planarized first contacts the outer region of the plate, is then optionally rinsed to remove coarse abrasive, and then is moved to the inner region of the plate. The planarized surface can then be rinsed using a solution, e.g., water-based or electrolyte-based solution, to remove both abrasive and abraded particles from the planarized layer. The abrasive slurry preferably is easily removable, e.g., water-soluble. Layer thickness, planarity and smoothness can be monitored, e.g., using an optical encoder, wear resistant stops, and by mating the layer under a known pressure with a precision flat metal plate and measuring the resistance across the plate-layer junction. Thickness of the plated metal can also be measured by, for example, contacting the plated metal with a mask having a pattern that is complementary to the plated metal pattern and measuring the displacement.

One example of a preferred planarization process includes allowing the work piece, i.e., the substrate having the layer to be planarized, to rotate within a "conditioning ring" on the lapping plate. Lapping can also be performed by moving a workpiece around the surface of a lapping plate using the X/Y motion stages of the electroplating apparatus without rotating or releasing the workpiece. In this way, the tangential motion of the plate with respect to the substrate rotates through 360 degrees. The timing of slurry delivery may be synchronized to the motion of the substrate such that the slurry is delivered to the plate. Movement of the workpiece can occur in paths other than circular including a path having a sinusoidal orbit of the form r=r0+AsinBθ.

The substrate to be plated can include a conductive surface or a nonconductive surface provided with a conductive layer. The substrate to be plated can be planar or nonplanar. The substrate to be plated can also be a previously electroplated or deposited metal or a layer that includes at least one metal.

The electroplating method can be performed, e.g., on an integrated circuit. One example of an electroplating method performed on an integrated circuit is shown in FIGS. 13a-13i. To permit electrical contact during plating, the aluminum pads can be connected to conductors that terminate at distant contact pads, which can be temporarily tied together by a bus. Referring to FIGS. 13a-13i, the electroplating method of this embodiment includes: spin coating a layer of polyimide 34 onto thin copper disk 36; adhering copper disk 36 to bottom surface of silicon wafer 38 with the polyimide coated surface of the copper disk contacting the bottom surface of the wafer (FIG. 13b), which includes aluminum pad 40, narrow conductor 42, contact pad 41, and passivation layer 44 (FIGS. 13a and 13b); partially sawing through wafer 38 to assist separation of the die after processing; spin coating photosensitive polyimide 35 on the top surface of wafer 38 to protect aluminum pads 40 and 41 during subsequent etching and to fill saw line 46; patterning polyimide to expose pads 40 to be plated and pads 41 for electrical contact (FIG. 13c); degreasing wafer; immersing the structure in zincate plating solution; applying photoresist and patterning to create a bus; joining contact pads 41 by sputtering of copper to form a bus 48 (FIG. 13d) that is in contact with pads 41 for the electroplating method; patterning resist 35 over bus 48 to prevent nickel from depositing on bus 48; plating enough nickel 50 (FIG. 13e) on aluminum pad 40 to allow planarization; removing the resist 35; making electrical contact with the plated metal; sputtering a planar base 51 and plating a sufficient amount of copper 52 over the entire wafer surface to allow planarization; planarizing surface to expose nickel 50 (FIG. 13g); electroplating the layers of the microstructure (FIG. 13h); etching copper 51 and 52 including bus 48 and copper disk 36; and stripping polyimide 34 thereby defining microstructure device 54 attached to wafer 38 (i.e., the integrated circuit) (FIG. 13i).

The electroplating methods can employ cyclic plating to improve uniformity of the deposited metal layer. Cyclic plating includes very briefly interrupting the current applied to the electrode in synchronization with removing the mask from the substrate to be plated, which simultaneously replenishes the electrolyte additives, vents any gases, and discharges particulates and broken-down additives from the microvolume defined by the support, the substrate to be plated, and the mask. Current is then re-applied in synchronization with contacting, i.e., remating, the mask with the substrate. This method can be repeated until the desired thickness of metal has been deposited. The walls of the mask can be given a slight taper or draft (i.e., negative features defined by the mask are slightly larger on the side of the mask contacting the substrate), to facilitate repeated contact of a mask with a substrate in the presence of a deposit of incomplete thickness.

Uniformity of the plated metal layer can be improved by controlling current density and adjusting current density on a feature-by-feature basis by controlling the local thickness, and optionally the local porosity, of the support of the electroplating article. Uniform plating can also be achieved by using an insoluble anode as a support, where the insoluble anode has a thin layer of a soluble coating located thereon that has a thickness calculated to provide the desired thickness of plated metal on the substrate. Once the finite amount of ions in the volume of electrolyte within the area defined by the mask (including ions created from any soluble coating that was initially part of the anode) are consumed plating ceases and the coating and the substrate are plated. As long as the initial coating on the insoluble anode is uniform in thickness, the plated metal will be uniform in thickness.

Hydrogen bubble formation can also be minimized by employing a low current density to increase current efficiency; decreasing temperature and/or pressurizing the electrolyte in bulk to increase the solubility of hydrogen in the electrolyte; employing a mask material that is impermeable to the electrolyte but gas permeable (e.g., a hydrophobic microporous material); performing the electroplating method under vacuum so that gas bubbles are pulled out of the mask features; employing antipitting agents (e.g., SNAP for nickel sulfamate electrolytes) to minimize the formation of pits by reducing the attachment of the gas bubbles to the substrate; increasing the masking pressure, which can locally increase electrolyte pressure due to reduced microvolume, which will establish large pressures on the electrolyte in localized areas keeping hydrogen in solution; and incorporating hydrogen gettering agent into the mask material (e.g., by mixing a fine powder into the liquid masking composition).

Examples of useful etching compositions for selectively stripping copper from nickel structures include: solutions of ammonium hydroxide and copper sulfate, solutions of ammonium hydroxide and sodium chlorite, with ammonium hydroxide-copper sulfate solution being preferred for etching structures attached to CMOS devices, and Enstripe C38 commercially available from Enthone OMI. Etching can also be performed in the presence of vibrations, e.g., ultrasound applied to the etchant or the substrate that was plated, pressurized jets of etchant contacting the metal to be etched, and surfactant. Flash present on the structural metal, e.g., in the form of thin projections extending from the surface of the structural metal, can be removed, e.g., by acid etching or electropolishing.

The electroplating methods can be used to manufacture elements having complex microstructure and close tolerances between parts. One example of a method for manufacturing elements having parts that fit with close tolerances, e.g., gaps between the parts are between about 1-5 um, involves electroplating the parts of the device in an unassembled, preferably pre-aligned, state. Once manufactured, the individual parts can be moved into operational relation with each other. Referring to FIGS. 14a-14e, a method of manufacturing device 188 including gear 190 and shaft 192 having retaining clips 200 includes the electroplating methods disclosed above. Assembly fixture 194 is plated in a pre-aligned location with gear 190 (FIG. 14a). Chuck 196 (e.g., electromagnetic or vacuum) secures the assembly fixture pieces 194 as support material 198 is etched (FIG. 14b). During etching gear 190 may fall into contact with shaft 192. Chuck 196 is then lowered, causing assembly fixture 194 to press gear 190 over retaining clips 200 on shaft 192 and into final position, as shown in FIG. 14c.

Chuck 196 is then raised removing assembly fixture 194 from the completed device 188, as shown in FIGS. 14*d* and 14*e*.

The electroplating method can also be used to manufacture elements in which at least a portion of the support metal (i.e. normally sacrificial metal) is enclosed within the structural material such that the enclosed sacrificial metal is not etched away during the removal process and thus becomes part of the structure of the element. Referring to FIGS. 15*a* and 15*b*, a cross section of a plated element 236 (FIG. 15*b*) is shown in which support metal 238 remains encapsulated within structural metal 240 after the portion of support metal 238 that is accessible by etchant (FIG. 15*a*) is removed.

Figure 16A:
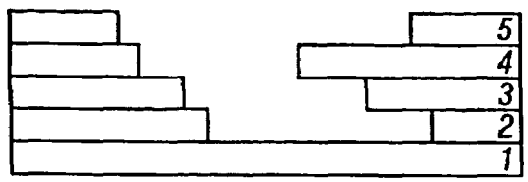
FIGS. 16a-16d are views taken in cross section of elements manufactured according to one embodiment of the invention.
Figure 16B:
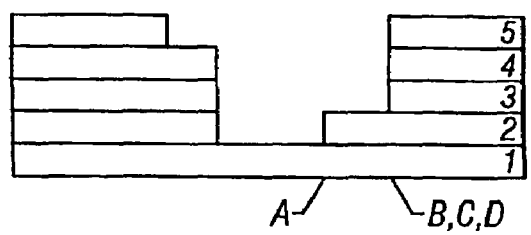
Figure 16C:
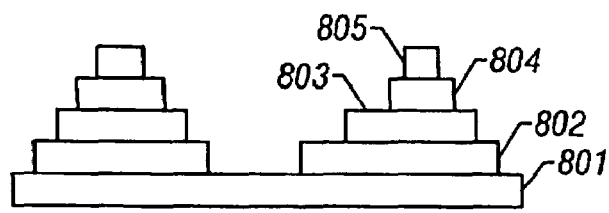
Figure 16D:

The electroplating processes can also be used to manufacture tooling for molding (e.g., injection molding, metal injection molding, reaction injection molding, thermoforming, blow molding, and die casting). Mold inserts can be manufactured by orienting mold inserts so that the ejection axis of the part is parallel to the stacking axis of the layers and the parting surface of the part to be molded is the last layer deposited. The electroplating methods can be used to form parts (i.e. elements) that include undercuts as shown in FIG. 16*a*, to form parts without draft as shown in FIG. 16*b*, and to form molds without undercuts and with draft by depositing layers of structural material where each subsequently plated layer of structural metal lies entirely within the boundary of the previously deposited layer (e.g., layers 801-805) of structural metal, as shown in FIGS. 16*c*. The object produced by the mold of FIG. 16*c* is shown in FIG. 16*d*. The mold of 16*c* can optionally be produced without the use of a support (i.e. sacrificial) material. Referring to FIG. 16*c*, layer 801 is deposited before layer 802, and so on.

Electroplating Apparatus

The electroplating method can be performed in a variety of electroplating apparatus. One particularly useful apparatus for carrying out an electroplating method is shown in the side view of FIG. 17. Apparatus 56 includes two baths 58, 60 (e.g., a nickel plating bath and a copper plating bath), and an inspection station 62. Each bath 58, 60 is constructed to be capable of electroplating a different metal. Each bath 58, 60 includes an electrolyte, an anode 59, 61, and an electroplating article 4, 14. As shown, apparatus 56 accommodates a single substrate to be plated 2. The apparatus can be constructed to accommodate multiple substrates to be plated and multiple electroplating articles. Each article 4, 14 includes at least one patterned conformable mask 6,16 and is capable of depositing a pattern of metal.

The mechanical and electrochemical control of the electroplating apparatus can be controlled by computers to implement the electroplating method. Substrate to be plated 2 is transported by precision motion stages 64*x*, 64*y*, 64*z*, equipped with DC servo motors, stepper motors or combinations thereof, and precision encoders, between plating baths 58, 60 and rinsing station 66. Substrate 2 suspended on chuck 68 enters first bath 58, positions itself over mask 6, contacts mask 6, and undergoes plating. After a predetermined thickness of metal has been plated onto substrate 2, substrate 2 is removed from bath 58, rinsed and transferred to second plating bath 60 where it contacts a second mask 16, undergoes plating to a predetermined thickness (preferably the same thickness of the first deposited metal), is rinsed, and is returned to first bath 58. Inspection station 62, including a high-resolution video microscope system with PC frame grabber, can be used in conjunction with control software to automatically record images of the deposited layers to a hard disk. Preferably apparatus 56 is enclosed in a sealed chamber and equipped with a vacuum system to degas the mask.

Useful mechanisms for applying controlled, uniform pressure to the substrate include applying a fluid pressure (e.g., through a pneumatic or hydraulic cylinder). One particularly preferred method for applying uniform pressure across a circular substrate includes applying pressure at the center of the substrate through a ball joint (e.g., a ball sandwiched between the cylinder or extension thereof and the substrate, possibly retained by a countersink in each). The ball allows the substrate to tilt as needed to conform to the mask surface and to find an equilibrium position within which pressure is uniformly distributed. The substrate can be held against the ball by surrounding the substrate with a tight-fitting flexible tube that is anchored at one end to the moving member.

A very stiff, precision mechanical slide (e.g., a mechanical slide that incorporates crossed roller bearings) can be used to provide repeatable positioning of the mated substrate. The stages that move in the plane of the deposited layer, X/Y stages, can be fixed in location by clamps (e.g., an electromagnetic brake).

Figure 17:
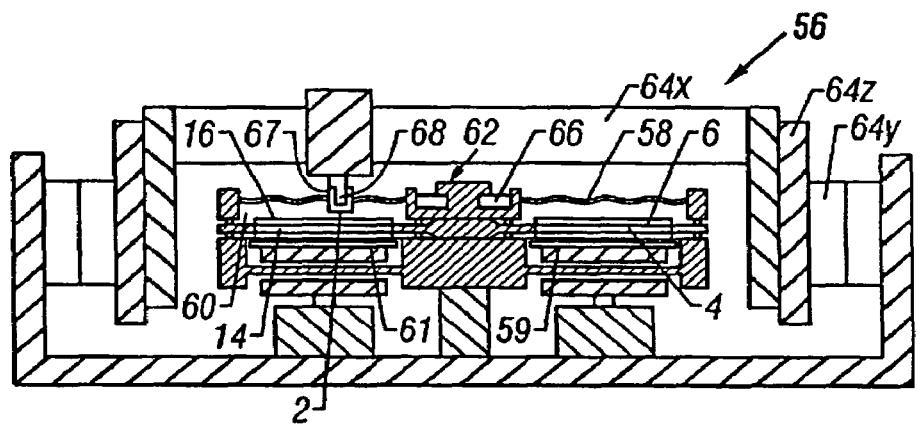
FIG. 17 is an electroplating apparatus according to one embodiment of the present invention.
Figure 18:
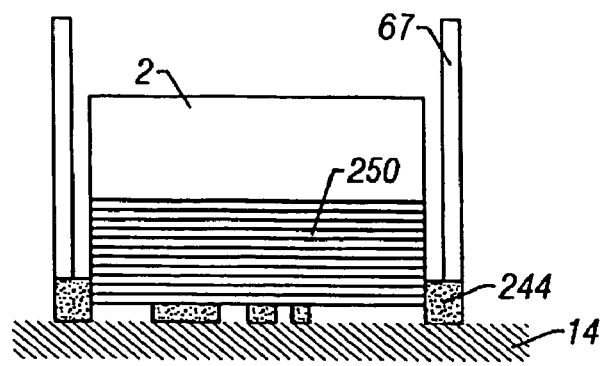
FIG. 18 is a view taken in cross section of a substrate in contact with an electroplating article.

The device (e.g., the chuck) that carries the substrate to be plated can include a sliding insulating tube that moves into position as metal layers are added to the substrate. Referring to FIGS. 17 and 18, sliding insulating tube 67 is shown in cross section in contact with edge mask 244 on support 14 and surrounding substrate 2 and plated metal layers 250.

The electroplating apparatus can be modified to include a device capable of directing a spray of electrolyte into the volume defined by the negative features of the article just prior to contacting the article to the substrate to be plated.

The electroplating apparatus can include a filtration system to control particulate contamination within the apparatus. After the electroplating articles and substrate(s) are loaded into the electroplating apparatus, the apparatus can execute a self-cleaning cycle that includes pressurized rising, ultrasonic agitation, and filtration. The air within the apparatus can be cleaned by a filtration system, e.g., a HEPA filtration system. The air and electrolyte filtration processes can operate continuously throughout the electroplating method. The electrolyte filtration system can be incorporated into a heating and pumping system to continuously circulate and warm the electrolyte to maintain homogeneous concentration and constant temperature.

The thickness of the plated metal and plated metal layer can be controlled, e.g., by measuring the deposition rates of the metals and plating for a predetermined period; monitoring the integrated current, with adjustments for plating efficiency, normalizing for calculated mask area and calculating plating thickness; and through closed loop thickness control. The closed loop system includes inputting an estimate, based upon measured metal plating rates, into the software that controls the electroplating method; plating a first metal to less than the desired thickness, pressing the substrate against a second electroplating article, such that the mask of the electroplating article contacts the first plated metal; forcing the substrate to move away from the support by an amount equal to the thickness of the plated layer; reading the thickness of the first plated metal using a high resolution (e.g., 0.1 um) encoder, linked to the substrate chuck; inputting this data into the software to update the stored rate value for the first metal; plating the remaining thickness of the first metal layer. This process and its complement for measuring the plating thickness of the second plated metal can be repeated every few layers as a calibration.

The position and orientation of the mask of the electroplating article with respect to the substrate and motion axes of the electroplating apparatus (described below) can be determined by an alignment procedure that uses reserved areas on the substrate to be plated and at least two distantly separated masks, each bearing an alignment pattern. To align the mask to the substrate, a thin layer of metal is plated onto the alignment pattern of the substrate, the rotational and translational misalignment of the mask with respect to the substrate is measured, e.g., using a video microscope, and corrections. Alignment accuracy can be verified by stripping the plated patterns and re-plating new patterns. Alignment can be repeated throughout the electroplating method as necessary.

Another example of a useful alignment method employs a vernier pattern in which a pattern of fine lines having a first pitch is deposited over a second pattern of lines having a different pitch. The pitch spacing of the deposited pattern compared to the existing pattern provides an indication of the alignment error.

Figure 19:
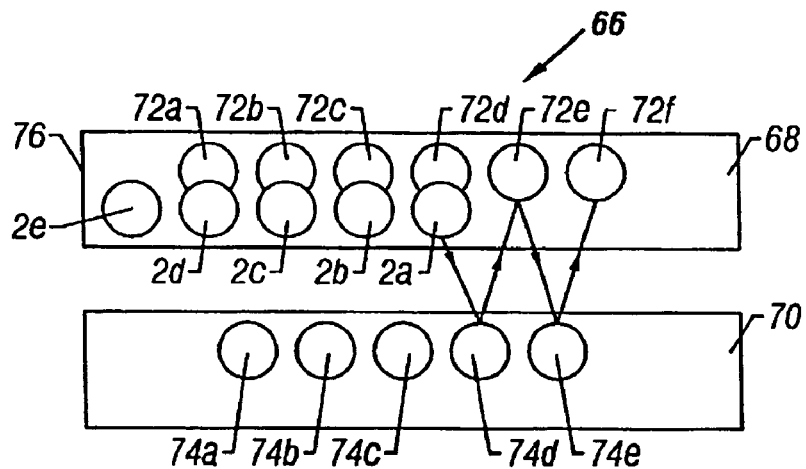
FIG. 19 is a top view of a portion of an electroplating apparatus of an embodiment of the invention.

Referring to FIG. 19, a portion of another electroplating apparatus 66 that includes bath 68 containing ions of a first metal, e.g., a nickel plating bath, bath 70 containing ions of a second metal, e.g., a copper plating bath, and multiple electroplating articles 72*a-f* and 74*a-e*, is shown. Each substrate to be plated (2*a*-2*e*) enters the apparatus 66 at the left end 76 of bath 68, contacts article 72*a*, becomes plated with a first metal in the pattern of the mask of article 72*a*, transfers to bath 70 after rinse (not shown), contacts article 74*a*, becomes plated with a second metal in the pattern of the mask on article 74*a*, transfers to article 72*b* after rinse (not shown), in bath 68 and so on. As depicted, substrate 2*a* has received deposits of the first metal and the second metal for the first three layers of the microstructure and the first metal portion of the fourth layer. Substrate 2*b* is one layer behind substrate 2*a*; substrate 2*c* is two layers behind substrate 2*a*, etc.

Figure 20:
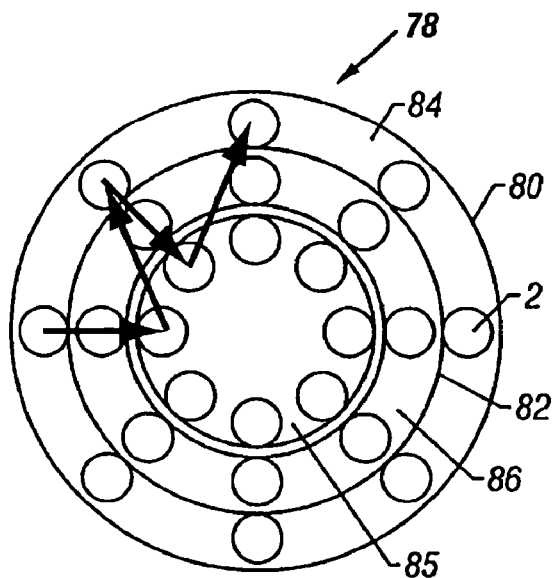
FIG. 20 is a top view of a portion of an electroplating apparatus according to an embodiment of the present invention.

For elements (e.g., devices) that require dozens or hundreds of deposited layers, the electroplating system can be arranged in an annular design in which the electroplating articles are arranged in rings and in which the individual electroplating articles are replaced after having contacted each of the substrates to be plated. One example of an apparatus for mass-producing electroplated structures is shown in FIG. 20. Apparatus 78 is designed to process 24 eight-inch diameter substrates 2. Apparatus 78 is concentric in design and includes an outer ring 80, and a middle ring 82 and a central disk 85. Outer ring 80 includes electrolyte bath 84 and electroplating articles (not shown) for selectively plating a first metal. Middle ring 82 includes an electrolyte bath 86 for blanket-plating a second metal. As opposed to blanket plating, middle ring 82 can include electroplating articles for selectively plating the second metal. A rotating lapping plate (if required), for planarizing the plated metal layers, is located at the center of apparatus 78. All processes (first metal selective plating, second metal blanket or selective plating and, optionally, planarization) occur during a single cycle, but on different substrates 2. At the end of the cycle, the substrates undergoing plating move in the pattern shown, in part, by arrows. Eight layers have been deposited after having completed all of the cycles in the system and arriving back at the starting point. Prior to the first substrate arriving back at the first plating article, the first plating article can be replaced by a new plating article. Likewise after the other plating articles have contacted each of the substrates they can be replaced, and substrates 2 can continue around apparatus 78, receiving as many layers as are required for the device being made. Rinsing stations are not shown but can be located in the spaces between the plating articles. It is anticipated that such an apparatus would permit the simultaneous manufacture of about 2.5 million devices, each 500 microns square by 200 microns tall, in an 8-hour period.

Figure 21:
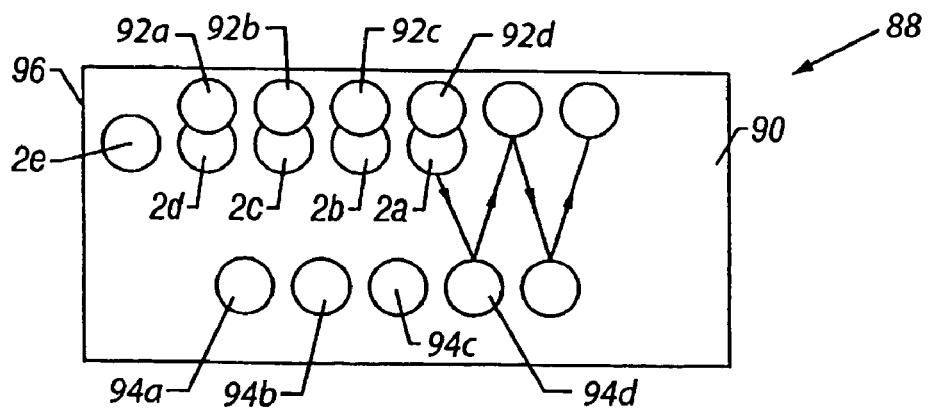
FIG. 21 is a top view of a portion of an electroplating apparatus according to an embodiment of the present invention.

The electroplating apparatus can also include a single bath containing ions of at least two metals (e.g., a Watts bath with added copper sulphate). A method for selectively depositing two metals from a common plating bath of their ions is described in H. Yahalom and O. Zadok, "Formation of Compositionally Modulated Alloys by Electrodeposition," J. Material Sci., Vol. 22, p. 494 (1987). The plating bath includes at least two electroplating articles, each of which is dedicated to plating one of the metals. The articles can include a single mask pattern or multiple mask patterns in a side-by-side arrangement on the surface of the support. In the case of an article having multiple mask patterns, the substrate can contact the different mask patterns in a predetermined sequence, alternating with the mask pattern(s) on the second article, to build a three dimensional structure. Referring to FIG. 21, an electroplating apparatus 88 that includes a single bath 90 containing ions of two metals, e.g., nickel and copper ions, articles for plating the first metal 92, articles for plating the second metal 94, and substrates 2*a-e*, is shown.

Each substrate 2*a*-2*e* enters apparatus 88 at the left end 96 of bath 90, contacts electroplating article 92*a* becomes plated with the first metal in the pattern of the mask of electroplating article 92*a*, transfers to and contacts article 94*a*, becomes plated with the second metal in the pattern of the mask on electroplating article 94*a*, transfers to electroplating article 92*b*, and so on. As depicted, substrate 2*a* has received deposits of the first metal and the second metal for the first three layers of the microstructure and the first metal portion of the fourth layer. Substrate 2*b* is one layer behind substrate 2*a*, substrate 2*c* is two layers behind substrate 2*a*, and so on.

A variety of methods can be used to improve the copper deposition rate in a common bath electroplating system including, e.g., pulsing the plating current, increasing temperature (e.g., laser enhanced plating), pumping electrolyte through the support of the electroplating article, ultrasonic vibration, and increasing the copper content in the vicinity of the copper disk. One method for locally increasing the concentration of copper includes galvanostatic dissolution of the copper anode while plating onto a dummy substrate. By applying a current pulse at a density of, e.g., about 20-50 mA/cm2, both nickel and copper are deposited onto the dummy substrate until sufficient copper to form a layer (about 1-2 um thick) is generated in the electrolyte located between the anode and the substrate. At this point the dummy substrate is substituted with the real substrate and the anode is replaced with a nickel anode. Copper is then deposited potentiostatically.

Figure 22:
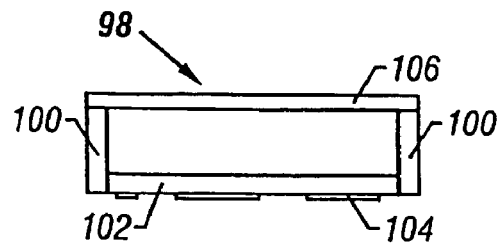
FIG. 22 is a view taken in cross section of an electroplating article holder of an embodiment of the present invention.

Another method for locally increasing the concentration of copper includes employing an electroplating article holder 98 as shown in FIG. 22. The volume of electroplating article holder 98 contains copper rich electrolyte and is defined by side walls 100 of a cylinder, a porous support 102 having a conformable mask 104, and anode 106 (e.g., an insoluble platinized titanium anode). Electroplating article holder 98 includes inlet and outlet ports for transferring electrolyte (not shown). This electroplating article holder can be immersed within a nickel-plating bath, optionally separated by a barrier through which the substrate can intermittently pass.

In general when there is a risk of spontaneous deposition onto a substrate while not in contact with an electroplating article, the substrate preferably is biased at a more positive potential than that at which copper reduction would occur until the substrate has contacted the copper-electroplating article and current has been applied. Similarly, when current is removed, the substrate preferably is again biased until the substrate is removed from the electrolyte, or applied to another article and current is again applied.

Figure 23:
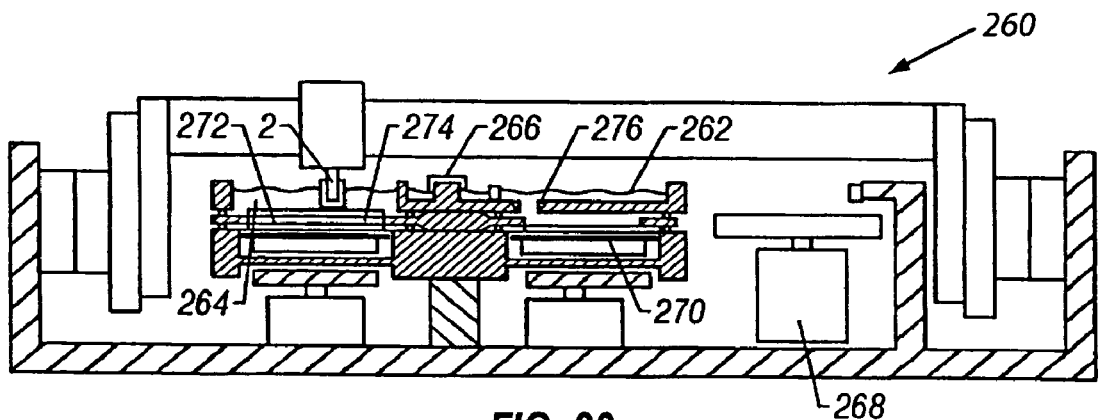
FIG. 23 is a view taken in cross section of an electroplating apparatus of an embodiment of the present invention.
Figure 24:
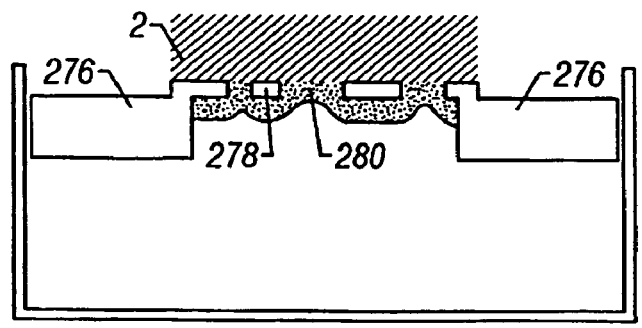
FIG. 24 is a highly enlarged view taken in cross section of a substrate in position in the electroplating apparatus of FIG. 23.

Another electroplating apparatus is shown in FIG. 23. Apparatus 260 includes baths 262, 264 (e.g., a nickel plating bath and a copper plating bath), by an inspection station 266, and lapping station 268. Each bath 262, 264 is constructed to be capable of electroplating a different metal. Each bath 262, 264 includes an electrolyte and an anode 270, 272. Bath 264 also includes an electroplating article 274 for selectively depositing a first metal. Bath 262 is used for blanket depositing a second metal. Bath 262 includes a mask 276 for insulating the sides of the structure (i.e. including the element) being fabricated on substrate 2 to prevent metal from plating on the sides of either the substrate or the structure. Referring to FIG. 24, a portion of electroplating apparatus 260 in which substrate 2 is positioned within electroplating bath 262 and is insulated, in part, by mask 276 is shown. Substrate 2 includes a selectively deposited layer 278 and a blanket deposited layer 280.

Figure 25:
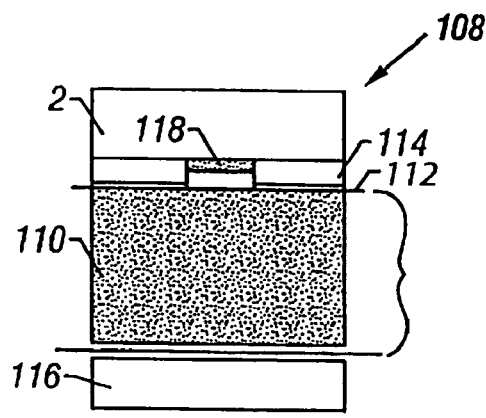
FIG. 25 is a view taken in cross section of a portion of an electroplating apparatus of an embodiment of the invention.

Referring to FIG. 25, an example of an electroplating apparatus that includes an electroplating article that includes a porous membrane is shown. Electroplating article 108, which is in contact with substrate to be plated 2, includes a relatively more rigid porous medium 110 having a relatively more coarse porosity, and relatively thinner, flexible porous membrane 112 having a relatively more fine porosity, and patterned mask 114 adhered to membrane 112. Patterned mask 114 is in contact with substrate 2 and anode 116 is disposed beyond porous medium 110. A metal deposit 118 is formed in the opening (i.e., within a negative feature) defined by mask 114.

Figure 26:
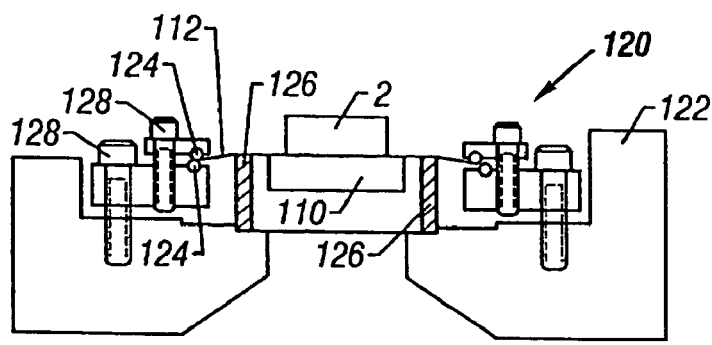
FIG. 26 is a view taken in cross section of another portion of the electroplating apparatus of FIG. 25.

Referring to FIG. 26, another example of an electroplating apparatus 120 that employs a porous membrane 112 is shown. Porous membrane 112 is mounted as a drumhead on drum frame 122 in a way that allows for handing and processing, maintenance of position of the membrane 112 with respect to the substrate, and allows pressure to be exerted on porous membrane 112 through rigid porous medium 110 contacting porous membrane 112. Porous membrane 112 is clamped between concentric O-rings 124, and pulled taut over a rigid porous medium, or, as shown, a cylindrical, hollow "barrel" 126 by tightening screws 128. If a barrel is used, rigid porous medium 110 is placed within barrel 126 so as to make contact with one side of membrane 112. Plating substrate 2 contacts the other side of porous membrane 112. An intermediate compliant material (not shown) e.g., an open pore foam, may be disposed between porous membrane 112 and rigid porous medium 110 to provide a more uniform contact pressure between the mask and plating substrate 2.

Automated Processing

Various embodiments of the invention also feature a method for generating mask patterns of very thin cross section for a three dimensional structure and a method for automated electroplating that includes contacting electroplating articles having the generated mask patterns in a predetermined sequence to form the three dimensional structure.

Figure 27:
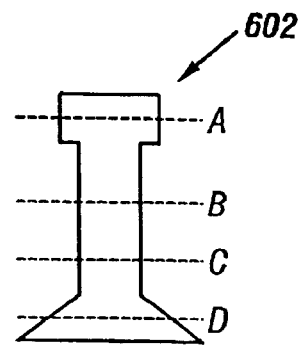
FIG. 27 is a diagram of a three dimensional object (shown in two dimensions) with cross section lines indicated.

One such embodiment employs an automatic mask minimization algorithm for optimizing the number of masks for a given geometry. Application of the method to a valve like device 602, shown in FIG. 27, can be described with reference to perforated lines A-D which indicate cross sections of the device 602. Cross-sections B and C are identical and cross sections A and D are identical. A single mask can be used for cross sections B and C and another mask can be used for cross sections A and D. The algorithm compares the newly calculated cross sections for use with a given metal with the previously calculated cross sections for the same device or possibly those used to make other devices. A new mask is generated if the difference between the two cross sections exceeds some predetermined (e.g., user specified) tolerance. This allows the number of masks to be minimized, allowing a greater number of layers to be produced from fewer electroplating articles. The program also generates an apparatus control file which directs the software that controls the electroplating apparatus such that masks are selected in a predetermined sequence corresponding to mask location within the electroplating apparatus and the layer being plated. The system can also export a layout file representing the first cross section of the part to be fabricated, allowing pad design for CMOS interfacing using a standard layout editor. The system can also display calculated cross sections to the user to allow error checking.

Figure 28:
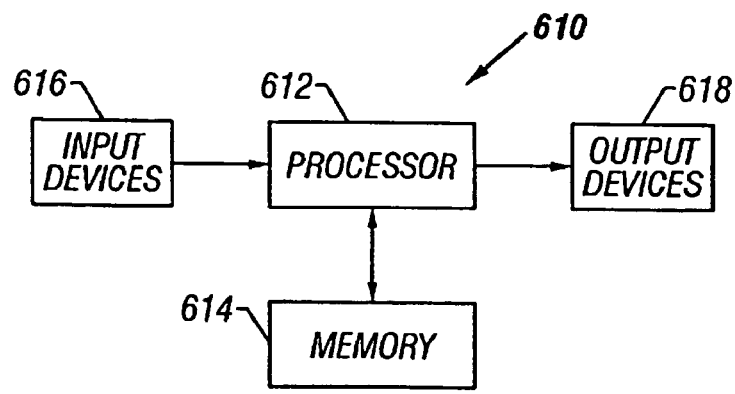
FIG. 28 is a functional block diagram of a computing system configured for calculation of cross sections of a three dimensional structure and for driving an electroplating apparatus of an embodiment of the present invention.

FIG. 28 is a functional block diagram of an exemplary computing system for calculation of cross sections of a three dimensional structure in accordance with an embodiment of the present invention. As shown in FIG. 28, system 610 may include a processor 612, a memory 614 (e.g., a random access memory (RAM), and a program memory (for example, a writable read-only memory (ROM) such as a flash ROM)), input devices 616, and output devices 618. Processor 612 includes a central processing unit (CPU) that forms part of a general-purpose computer, such as a PC, Macintosh, or workstation. Memory 614 stores program code for execution by processor 612 including operating system code and application program code, and generally represents a magnetic hard drive or other storage device in combination with a random access memory accessed by processor 612. As one example, memory 614 could be realized in part by a storage drive contacting removable storage media carrying the application program code. Input devices 616 include input media for entry of user input, such as a keyboard, mouse, and the like. Output devices 618 include display devices including a view screen that provides graphic output, e.g., a CRT or flat panel monitor, a printer (e.g., a desk top printer, an inkjet printer, a laser printer, a photoplotter, and the like), the electroplating apparatus, a linotronic printer and the like.

Figure 29:
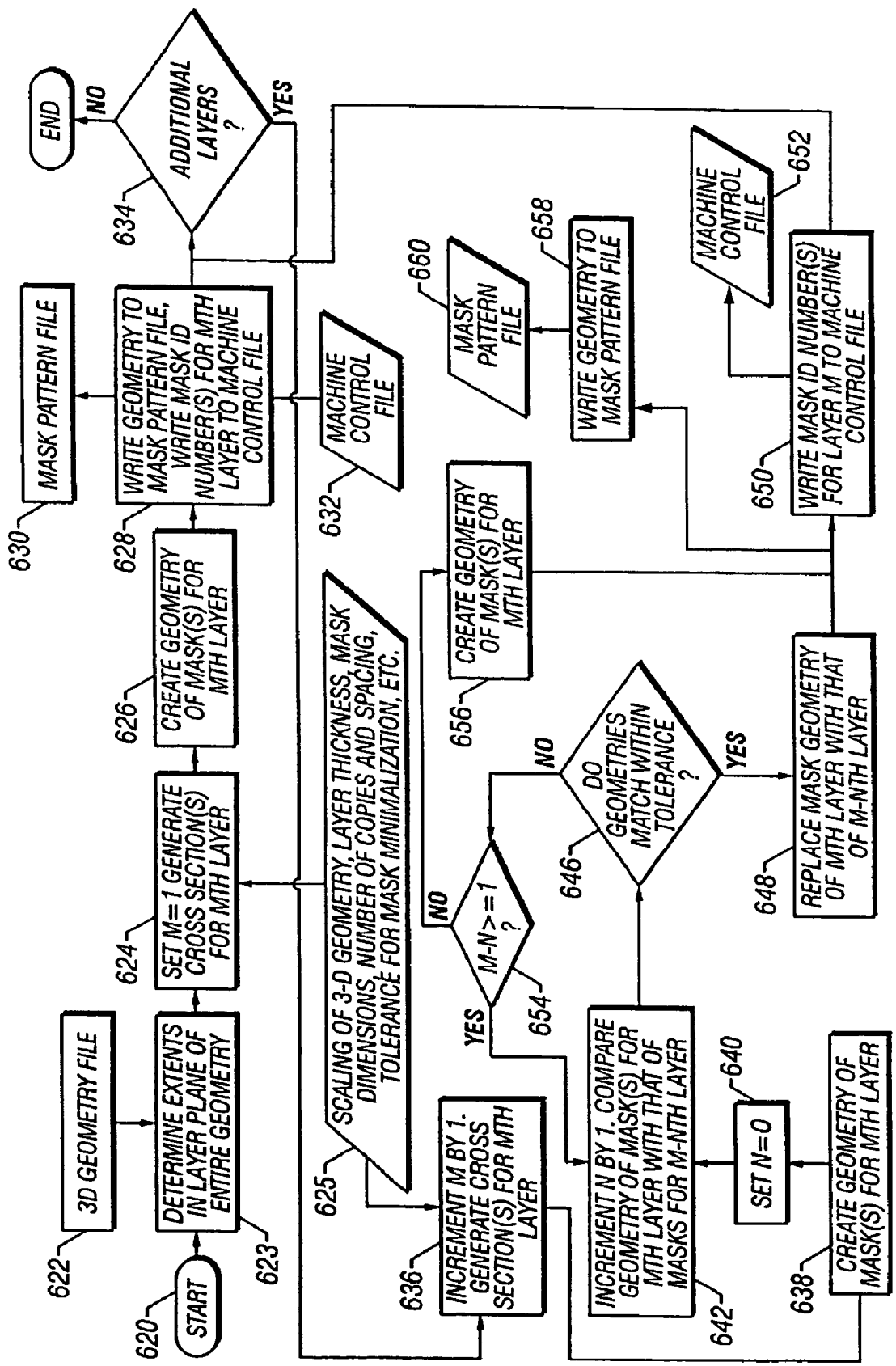
FIG. 29 is a flow diagram illustrating a method for generating mask pattern files and apparatus control files.

FIG. 29 is a flow diagram illustrating a method for generating mask geometries and machine control parameters for fabrication of a three dimensional structure. When the user starts the application program, as indicated by reference numeral 620, processor 612 receives and processes input corresponding to the three dimensional geometry of a structure to be cross sectioned from input devices 616 as indicated by block 622. Processor 612 determines the extents in layer plane of the entire geometry of the three-dimensional structure as indicated by block 623. Processor 612 sets M, the number of layers (including one or more cross sections), equal to 1 and generates cross sections for the Mth layer, as indicated by block 624. Processor 612 reads inputs relevant to each mask geometry including, e.g., scaling of the three dimensional geometry, layer thickness, mask dimensions, number of copies and spacing, and tolerance for mask minimization, as indicated by block 625. Processor 612 creates the geometry of mask corresponding to the Mth layer, as indicated by block 626, writes the geometry of the cross section(s) to a mask pattern file, indicated by blocks 628 and 630, and writes mask identification numbers for the Mth layer to a machine control file, as indicated by blocks 628 and 632. Memory 614 stores mask pattern in the mask pattern file, as indicated at block 630. Memory 614 stores location information in machine control file, as indicated at block 632. Processor 612 queries if additional layers are needed to complete the geometry of the three-dimensional structure, as indicated at block 634.

If so, processor 612 increments N by 1 and compares the geometry of mask for Mth layer with that of mask for M-Nth layer, as indicated at block 642. If processor 612 calculates that the geometry of the Mth layer has been compared to the geometry of each previous mask and no geometry matches have occurred (i.e. a "no" answer to the inquiry of 654), then processor 612 creates a geometry of the mask for the Mth layer, as indicated at block 656. Processor 612 then writes the geometry for the Mth layer to the mask pattern file (as indicated by block 658), sends an output to the mask pattern file, as indicated by block 660, and writes mask identification number for the Mth layer to the machine control file (as indicated by blocks 650 and 652).

If not, processor 612 queries whether M-N is greater than or equal to 1 as indicated at block 654.

If so, processor 612 increments N by 1 and compares the geometry of mask for Mth layer with that of mask for M-Nth layer, as indicated at block 642. If processor 612 calculates that the geometry of the Mth layer has been compared to the geometry of each previous mask and no geometry matches, then processor 612 creates a geometry of the mask for the Mth layer, as indicated at block 656. Processor 612 then writes the geometry for the Mth layer to the mask pattern file (as indicated by block 658), sends an output to mask pattern file, as indicated by block 660, and writes mask identification number for the Mth layer to the machine control file (as indicated by blocks 650 and 652).

Processor 612 queries whether additional layers are required to be made of the three dimensional object (as indicated by block 634).

If so, processor 612 increments M by 1 and continues the process again.

If not, the process ends.

Figure 30:
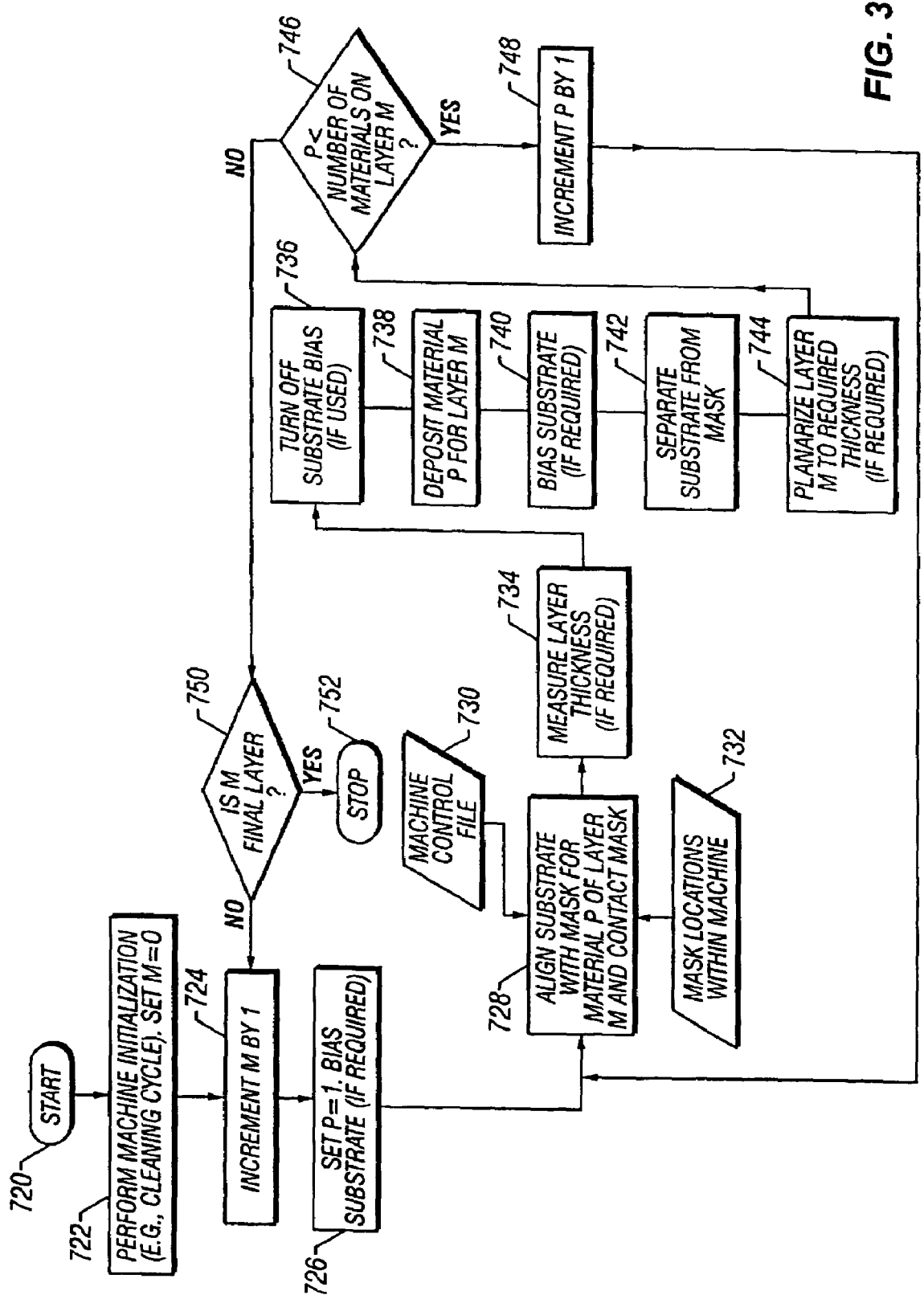
FIG. 30 is a flow diagram illustrating a method for manufacturing a three dimensional object.

FIG. 30 is a flow diagram illustrating a method for electroplating a metal onto a substrate using patterned masks that represent a cross sectional slice of a three dimensional object. When the user starts the application program, as indicated by reference numeral 720, processor 612 signals the electroplating apparatus to perform machine initialization and sets M, the number of layers plated equal to zero, as indicated at block 722. Processor 612 increments M by 1 (as indicated by block 724), sets P (i.e., the number of different metals to be plated) equal to 1 and optionally biases the substrate to prevent spontaneous deposition of the metal (as indicated by block 726). Processor 612 reads machine control file (indicated by block 730) to obtain control information about the layer that is to be plated, and reads mask location file (indicated by block 732) to obtain information about the location of the mask pattern to be plated. Processor 612 directs the electroplating apparatus to align the substrate to be plated with the mask for material P of layer M and to contact the substrate to the mask (indicated by block 728). Processor 612 optionally measures layer thickness, if necessary, as indicated by block 734. Processor 612 receives input that the substrate is in contact with the mask and turns off substrate bias (if turned on), as indicated by block 736. Processor 612 instructs apparatus to deposit material P for layer M, as indicated by block 738. Processor 612 receives input that the cross-section has been deposited and applies a bias to the structure, if required, as indicated by block 740. Processor 612 instructs apparatus to remove the substrate from contact with the mask (as indicated at block 742), and to planarize layer M to predetermined thickness (if necessary), as indicated at block 744. Processor queries whether P is less than the number of metals of layer M, as indicated by block 746.

If so, processor 612 increments P by 1 (as indicated by block 748), and drives the electroplating apparatus to align the substrate with a mask corresponding to the new value for P (i.e., the P metal of layer M), as indicated by block 728. Processor 612 drives electroplating apparatus to contact the substrate with the mask (as indicated by block 748), and the above process is repeated until P is equal to the number of metals on layer M.

Turning back to block 746, if P is not less than the number of materials on layer M, processor 612 queries whether M is the final layer (as indicated by block 750).

If so, processor 612 ends the electroplating process as indicated by numeral 752.

If not, processor 612 increments M by 1 as indicated by block 724, and processor 612 drives the electroplating process until the final layer has been plated.

The data processes and control processes of various embodiments of the invention can be implemented in digital electronic circuitry, or in computer hardware, firmware, software, or in combinations thereof. The data processes and control processes of various embodiments of the invention can be implemented in a computer program product tangibly embodied in a machine-readable storage device for execution by a programmable processor; and method steps of various embodiments of the invention can be performed by a programmable processor executing a program of instructions to perform functions of those embodiments of the invention by operating on input data and generating output. The data processes and control processes of various embodiments of the invention can advantageously be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the data processes and control processes of various embodiments of the invention can be implemented on a computer system having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

Other embodiments are possible. Although the above description is directed to planar substrates, the substrate could be non-planar. In such embodiments, the electroplating article can be sufficiently flexible to conform to the shape of the substrate surface, or shaped to match the surface. For example, the electroplating article could be wrapped around a cylindrical substrate. Masking pressure can be applied to nonplanar substrates through a powdered medium that conforms to the mask.

In addition, although the electroplating embodiments have been described above with respect to the use of two metals, a variety of materials, e.g., polymers, ceramics and semiconductor materials, and any number of metals can be deposited either by the electroplating methods described above, or in separate processes that occur throughout the electroplating method. A thin plating base can be deposited, e.g., by sputtering, over a deposit that is insufficiently conductive (e.g., an insulating layer) so as to enable subsequent electroplating. Multiple support materials (i.e. sacrificial materials) can be included in the electroplated element allowing selective removal of the support materials.

Figure 31:
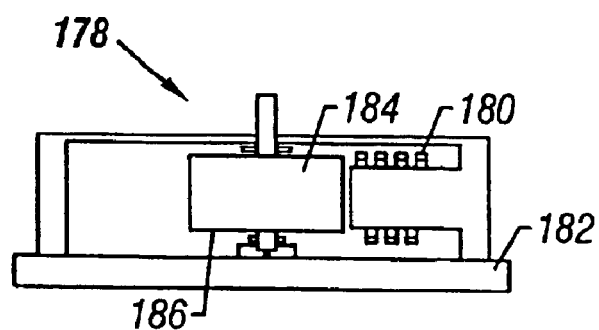
FIG. 31 is a view taken in cross section of an electromagnetic motor.

The electroplating methods of various embodiments of the invention can be used in combination with other processes. Referring to FIG. 31, for example, electromagnetic motor 178 including armature windings 180 connected to an integrated circuit at aluminum pads on substrate 182, can be formed by interrupting the electroplating method and etching a portion of the support metal (e.g., using a patterned resist) to produce cavity 184 (i.e., the rotor core of the motor) defined by structural metal 186 serving as an etch stop. Cavity 184 is then filled with a magnetic powder (e.g., Ne—Fe—B), which is subsequently sintered and magnetized. If necessary, metal is sputtered onto the sintered magnetic powder to establish a plating base and the electroplating method can be resumed. Such cavities can be filled with solids, fluids or evacuated to form a vacuum.

Where multiple metals are to be deposited, the metals can be selectively deposited on the substrate by masking only the substrate. By only masking the substrate, the metal being selectively plated onto the substrate is also deposited onto the previously deposited metals. After each of the metals for a given layer has been deposited the layer is planarized to the desired thickness. Alternatively, the mask can cover all of the previously deposited metals. In this alternative, the mask can also be stepped in thickness to accommodate the topography of a partially plated substrate.

Another embodiment of the electroplating method involves manufacturing a structure well defined in shape and position according to the following method: preparing a piece of rigid, high strength material with an interconnected porosity (e.g., partly-sintered ceramic); shaping one surface of this piece such that it has the inverse (in the mold making sense) shape to that of the desired deposit; positioning the piece so that its surface lies opposite the substrate to be plated, at the desired position of the final deposit surface, and placing an anode on the other side of it; plating metal onto the substrate while moving the piece (continuously or periodically) with sufficient force and in such a way that its surface still remains matched to that of the desired deposit (for a planar surface, move it within the plane, for a cylindrical surface, move it axially, etc.) (The movement can be a vibration sufficiently large to shear and remove any portion of the deposit that extends into the pores of the piece); continuing plating until the entire volume between the substrate and the piece is filled with the deposit, at which point the deposit will have molded itself to the shape of the piece. The piece can be disposed of, or periodically reconditioned by chemically flushing the piece with fluid, dissolving the clogging material or placing the clogged surface in contact with an anode and deplating it onto a substrate in an electrolyte.

Figure 32A:
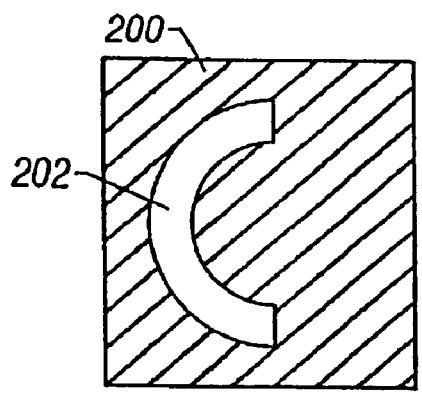
FIGS. 32a-32d are diagrams of an electroplating method employing more than one article according to a third embodiment of the invention.
Figure 32B:
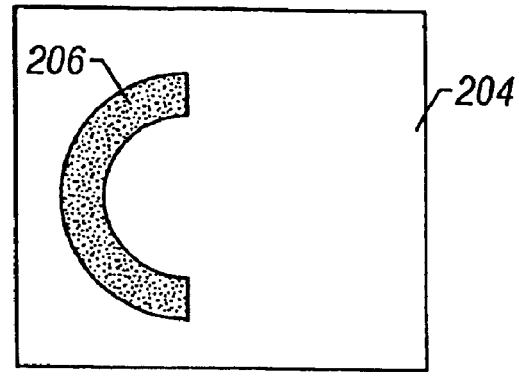
Figure 32C:
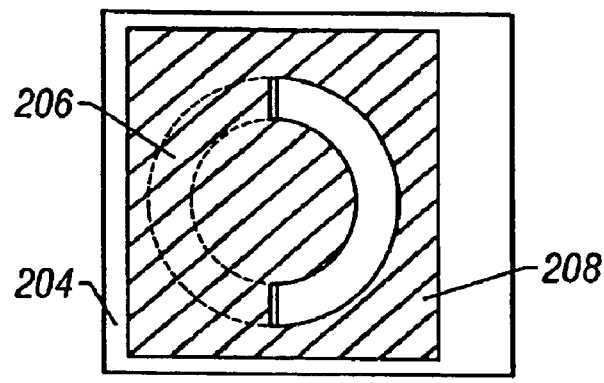
Figure 32D:
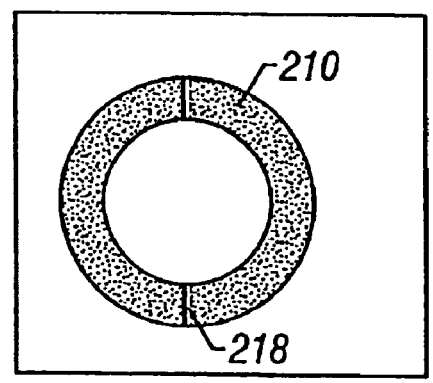

Referring to FIGS. 32*a*-32*d*, another embodiment of an electroplating article is shown. Electroplating article 200 includes a mask adhered to and coextensive with a patterned, rigid substrate (e.g., polymethylmethacrylate). During the electroplating method a deposit is formed in the window(s) (i.e., negative mask features) of the article. More specifically, substrate 204 is contacted with a first patterned electroplating article 200, as shown in FIG. 32*a*; a first metal deposit 206 is formed in a shape defined by the pattern 202 in first electroplating article 200, first article 200 is then removed (FIG. 32*b*); substrate 204 is then contacted in alignment with a second patterned electroplating article 208 (FIG. 32*c*), deposit 210 is formed, and second article 208 is removed (FIG. 32*d*). The plated metal is then planarized and the method repeated until an element of sufficient thickness and dimension has been achieved. The electroplating articles can include a region 210 of overlapping plated metal, which will have a corresponding greater thickness. The overlapping region can be planarized to create a planar layer of deposited metal. Masking pressure can be applied by pressing an anode or porous medium against the electroplating article. The mask can be made stiffer by increasing its thickness.

Although the electroplating methods have been described with respect to contacting a cathode with an article and plating onto a cathode, it is contemplated that the electroplating article can be placed in contact with a substrate functioning as an anode such that metal is selectively removed from the anode in a pattern corresponding to the pattern on the electroplating article. Such a process can be employed to selectively etch, engrave, and polish a substrate, e.g., a plaque.

An electroplating method includes forming a layer, the forming of the layer includes: a) contacting a substrate with a first article, the first article includes a support and a conformable mask disposed in a pattern on the support; b) electroplating a first metal from a source of metal ions onto the substrate in a first pattern, the first pattern corresponding to the complement of the conformable mask pattern; and c) removing the first article from the substrate. The method may further involve one or more of (1) selectively depositing or non-selectively depositing one or more additional materials to complete formation of the layer, (2) planarizing deposited material after each deposition or after all depositions for a layer, and/or (3) forming layers adjacent previously formed layers to build up a structure from a plurality of adhered layers. Electroplating articles and electroplating apparatus are also disclosed.

What is claimed:

1. A method for fabricating a multi-layer three-dimensional structure, comprising:
   (i) forming a first layer, comprising:
      a) providing a first mask in contact with a substrate, wherein the mask has a first pattern of openings therein;
      b) electrodepositing a first pattern of a first material from a source of the first material onto said substrate using the first mask to form a portion of a first layer;
      c) removing the first mask from the substrate;

d) providing a second mask in contact with the substrate, and/or the first material, wherein the mask has a second pattern of openings therein;
e) electrodepositing a second pattern of a second material from a source of the second material onto said substrate and/or the first material using the second mask to form a portion of the first layer; and
f) removing the second mask from the substrate and/or first material;

(ii) building additional layers adjacent to and adhered to previously formed layers to build up the multi-layer three-dimensional structure, wherein the first material comprises a sacrificial material and the second material comprises a structural material, and (iii) releasing the structural material from the sacrificial material after the build up of the multi-layer structure.

2. The method of claim 1 wherein the first material is a first metal.

3. The method of claim 2 wherein the second material is a second metal.

4. The method of claim 1 wherein the forming of the first layer further comprises removing a portion of each of the first material and the second material during a process of planarizing a surface of the first layer.

5. The method of claim 1 wherein the forming of the first layer additionally comprises depositing a third material onto the substrate and/or onto one or both of the first or second materials.

6. The method of claim 5 wherein the forming of the first layer additionally comprises removing a portion of each of the first material, second material, and third material.

7. The method of claim 5 wherein at least one of the first, second, or third materials comprises a structural material.

8. The method of claim 7 wherein at least one of the first, second, or third materials comprises a sacrificial material.

9. The method of claim 7 wherein at least two of the first, second, and third materials are the same material.

10. The method of claim 9 wherein a plurality of the materials deposited in separate deposition operations are the same and wherein the plurality of depositions result in the complete patterning of a desired material on the first layer.

11. The method of claim 10 wherein the complete patterning is formed by complementary patterned depositions.

12. The method of claim 1 wherein the first and second patterned masks only contact the substrate.

13. The method of claim 1 wherein the second patterned mask only contacts first material.

14. The method of claim 1 wherein the second patterned mask contacts both the substrate and the first material.

15. A method for fabricating a multi-layer three-dimensional structure, comprising:
(i) forming a first layer, comprising:
a) providing a first mask in contact with a substrate, wherein the mask has a first pattern of openings therein;
b) electrodepositing a first pattern of a first material from a source of the first material onto said substrate using the first mask to form a portion of a first layer;
c) removing the first mask from the substrate;
d) providing a second mask in contact with the substrate, and/or the first material, wherein the mask has a second pattern of openings therein;
e) electrodepositing a second pattern of a second material from a source of the second material onto said substrate and/or the first material using the second mask to form a portion of the first layer; and
f) removing the second mask from the substrate and/or first material;

(ii) building additional layers adjacent to and adhered to previously formed layers to build up the multi-layer three-dimensional structure, wherein the first material comprises a structural material and the second material comprises a sacrificial material; and (iii) releasing the structural material from the sacrificial material after the build up of the multi-layer structure.

16. A method for fabricating a multi-layer three-dimensional structure, comprising:
(i) forming a first layer, comprising:
a) providing a first mask in contact with a substrate, wherein the mask has a first pattern of openings therein;
b) electrodepositing a first pattern of a first material from a source of the first material onto said substrate using the first mask to form a portion of a first layer;
c) removing the first mask from the substrate;
d) providing a second mask in contact with the substrate, and/or the first material, wherein the mask has a second pattern of openings therein;
e) electrodepositing a second pattern of a second material from a source of the second material onto said substrate and/or the first material using the second mask to form a portion of the first layer;
f) removing the second mask from the substrate and/or first material; and
g) removing a portion of the first material and a portion of the second material during a process of planarizing a surface of the first layers;

(ii) building additional layers adjacent to and adhered to previously formed layers to build up the multi-layer three-dimensional structure, wherein one of the first material or the second material comprises a structural material and another of the first material or the second material comprises a sacrificial material, and (iii) releasing the structural material from the sacrificial material after building the additional layers of the multi-layer structure.

* * * * *